US009299794B2

(12) United States Patent
Nitta

(10) Patent No.: US 9,299,794 B2
(45) **Date of Patent: *Mar. 29, 2016**

(54) SEMICONDUCTOR DEVICE

(71) Applicant: Renesas Electronics Corporation, Kawasaki-shi, Kanagawa (JP)

(72) Inventor: Kyoya Nitta, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/580,035

(22) Filed: Dec. 22, 2014

(65) Prior Publication Data

US 2015/0102408 A1 Apr. 16, 2015

Related U.S. Application Data

(60) Continuation of application No. 14/214,990, filed on Mar. 16, 2014, now Pat. No. 8,933,511, which is a division of application No. 13/365,211, filed on Feb. 2, 2012, now Pat. No. 8,698,241.

(30) Foreign Application Priority Data

Feb. 4, 2011 (JP) ................................ 2011-022390

(51) Int. Cl.
*H01L 29/78* (2006.01)
*H01L 29/417* (2006.01)
(Continued)

(52) U.S. Cl.
CPC .... *H01L 29/41775* (2013.01); *H01L 21/28518* (2013.01); *H01L 21/32051* (2013.01);
(Continued)

(58) Field of Classification Search
CPC ..................... H01L 29/41775; H01L 29/4175; H01L 29/41758; H01L 29/66659; H01L 29/7816; H01L 29/7835; H01L 29/0865; H01L 29/0882; H01L 21/28518; H01L 21/32051; H01L 21/76838; H01L 23/4824; H01L 23/485; H01L 23/5222
See application file for complete search history.

(56) References Cited

U.S. PATENT DOCUMENTS 7,932,572 B2 4/2011 Tsujiuchi
2006/0120147 A1 6/2006 Peng et al.
(Continued)

FOREIGN PATENT DOCUMENTS

JP 2007-173314 A 7/2007
JP 2009-32968 A 2/2009
(Continued)

OTHER PUBLICATIONS

Office Action issued Oct. 12, 2015, in Chinese Patent Application No. 201210025734.6.

*Primary Examiner* — Whitney T Moore
(74) *Attorney, Agent, or Firm* — Shapiro, Gabor and Rosenberger, PLLC

(57) ABSTRACT

A semiconductor device with improved characteristics is provided. The semiconductor device includes a LDMOS, a source plug electrically coupled to a source region of the LDMOS, a source wiring disposed over the source plug, a drain plug electrically coupled to a drain region of the LDMOS, and a drain wiring disposed over the drain plug. The structure of the source plug of the semiconductor device is devised. The semiconductor device is structured such that the drain plug is linearly disposed to extend in a direction Y, and the source plug includes a plurality of separated source plugs arranged at predetermined intervals in the direction Y. In this way, the separation of the source plug decreases an opposed area between the source plug and the drain plug, and can thus decrease the parasitic capacitance therebetween.

7 Claims, 27 Drawing Sheets

(51) Int. Cl.

| | |
|---|---|
| ***H01L 21/285*** | (2006.01) |
| ***H01L 23/482*** | (2006.01) |
| ***H01L 23/485*** | (2006.01) |
| ***H01L 21/3205*** | (2006.01) |
| ***H01L 23/522*** | (2006.01) |
| ***H01L 23/528*** | (2006.01) |
| ***H01L 21/768*** | (2006.01) |
| *H01L 29/08* | (2006.01) |
| *H01L 29/10* | (2006.01) |
| *H01L 29/45* | (2006.01) |
| *H01L 29/49* | (2006.01) |
| *H01L 29/66* | (2006.01) |

(52) U.S. Cl.

CPC ........ *H01L21/76838* (2013.01); *H01L 23/485* (2013.01); *H01L 23/4824* (2013.01); *H01L 23/5222* (2013.01); *H01L 23/5283* (2013.01); *H01L 29/0865* (2013.01); *H01L 29/0882* (2013.01); *H01L 29/4175* (2013.01); *H01L 29/41758* (2013.01); *H01L 29/66659* (2013.01); *H01L 29/7816* (2013.01); *H01L 29/7835* (2013.01); *H01L 29/0847* (2013.01); *H01L 29/1083* (2013.01); *H01L 29/456* (2013.01); *H01L 29/4933* (2013.01); *H01L 29/665* (2013.01); *H01L 29/6656* (2013.01); *H01L 2924/0002* (2013.01)

(56) References Cited

U.S. PATENT DOCUMENTS

| | | | |
|---|---|---|---|
| 2009/0224318 | A1 | 9/2009 | Hatori et al. |
| 2010/0052091 | A1 | 3/2010 | Tanaka et al. |

FOREIGN PATENT DOCUMENTS

| | | | |
|---|---|---|---|
| JP | 2009-194210 | A | 8/2009 |
| JP | 2010-50219 | A | 3/2010 |

SEMICONDUCTOR DEVICE

CROSS-REFERENCE TO RELATED APPLICATIONS

The disclosure of Japanese Patent Application No. 2011-22390 filed on Feb. 4, 2011 including the specification, drawings and abstract is incorporated herein by reference in its entirety.

BACKGROUND

The present invention relates to semiconductor devices, and more particularly, to a technique effectively applied to a semiconductor device including a laterally diffused metal-oxide-semiconductor field-effect transistor (LDMOSFET).

In recent years, mobile communication devices (which are the so-called mobile phones) using a communication system, such as a global system for mobile communications (GSM) system, a personal communications service (PCS) system, a personal digital cellular (PDC) system, or a code separation multiple access (CDMA) system, have been widespread.

In general, this kind of mobile communication device includes an antenna for radiating and receiving radio waves, a high-frequency power amplifier (radio frequency (RF) power module) for amplifying a power-modulated high-frequency signal to supply the amplified signal to the antenna, a receiver for processing the high-frequency signal received by the antenna, a controller for controlling these components, and a cell (battery) for applying a power-supply voltage to these components.

The above high-frequency power amplifier is required to have a high breakdown resistance against large variations in load. An amplification device, such as a high-frequency power amplifier, uses a number of laterally diffused MOS (LDMOS) transistors.

For example, the following Patent Document 1 (Japanese Unexamined Patent Publication No. 2010-50219) discloses a semiconductor device which includes a gate oxide film (24*a*) and a gate electrode (25*a*) formed over an N-type epitaxial layer (12) of a LDMOS portion (10*a*). In an interlayer insulating layer (14) of the LDMOS portion (10*a*), contact wirings (26*a* to 26*c*) are formed to electrically coupling each source electrode or each drain electrode to $P^+$-type regions (17*a* to 17*c*) or an $N^+$-type region (18).

The following Patent Document 2 (Japanese Unexamined Patent Publication No. 2009-32968) discloses a semiconductor device using a drain region (5) of a LDMOS as a cathode region (11) of a diode, and a back gate region (4) of the LDMOS as an anode region (14) of the diode. In the semiconductor device, a drain electrode (9) electrically coupled to the drain region (5) and a source electrode (8) electrically coupled to the back gate region (4) are formed in contact holes of an interlayer insulating layer (10).

The following Patent Document 3 (Japanese Unexamined Patent Publication No. 2007-173314) discloses a semiconductor device which includes a p-type punched layer (4) for electrically coupling a source region of a LDMOSFET to a source backside electrode (36) formed at the backside of a substrate (1). The p-type punched layer (4) is formed of a p-type polycrystal silicon film having a low resistance and doped with impurities in a high concentration, or a metal film having a low resistance. A source wiring for electrically coupling sources of basic cells of the above LDMOSFETs is only a wiring 24A. The number of wiring layers forming a source wiring is set smaller than that of wiring layers forming drain wirings (interconnects 24B, 29B, and 33).

In the description of the present application, reference numerals in parentheses indicate respective elements disclosed in each patent document.

RELATED ART DOCUMENTS

Patent Documents

[Patent Document 1]
Japanese Unexamined Patent Publication No. 2010-50219
[Patent Document 2]
Japanese Unexamined Patent Publication No. 2009-32968
[Patent Document 3]
Japanese Unexamined Patent Publication No. 2007-173314

SUMMARY

The inventors are involved in studying and developing the LDMOSEFT (laterally diffused metal-oxide-semiconductor field effect transistor, laterally diffused MOSFET, or LDMISFET, hereinafter simply referred to as a “LDMOS”) which is used in the above-mentioned mobile communication device.

The above LDMOS employs a structure in which impurities are laterally diffused near a drain region in order to increase a breakdown voltage. The source region of the LDMOS is coupled to a source line via a source contact, and the drain region of the LDMOS is coupled to a drain line via a drain contact.

In this case, a parasitic capacitance is generated between a source contact and a drain contact, and between a source line and a drain. The parasitic capacitance is increased with the miniaturization of elements, which degrades the characteristics or performance of the semiconductor device with the LDMOS.

In particular, a high-frequency power amplifier for the mobile communication device using the LDMOS is required to have a high power efficiency for the necessity of holding an operating time of the device (equipment) for a long time on a single charge of the battery (cell). The power efficiency means the ratio of power output from the high-frequency power amplifier to power input into the high-frequency power amplifier. The above-mentioned parasitic capacitance causes reduction in power efficiency, resulting in degradation of the characteristics of the entire semiconductor device (equipment).

Accordingly, it is an object of the present invention to improve the characteristics of a semiconductor device with a LDMOS. In particular, the invention has the object to improve the characteristics of the semiconductor device with the LDMOS by decreasing the parasitic capacitance of the semiconductor device.

Further, it is another object of the invention to improve the characteristics of the semiconductor device with the LDMOS while reducing the size of the semiconductor device.

The outline of representative aspects of the invention disclosed in the present application will be briefly described below.

A semiconductor device according to a representative embodiment of the invention disclosed in the present application includes: (a) a laterally diffused MISFET, including: (a1) a gate electrode disposed over a first surface of a semiconductor substrate via a gate insulating film to extend in a first direction, and (a2) a source region disposed in the semiconductor substrate on one side of the gate electrode, and a drain region disposed in the semiconductor substrate on the other side of the gate electrode. The semiconductor device also includes (b) a source contact disposed in a second region located on the one side of the gate electrode over the semiconductor substrate to be electrically coupled to the source region; (c) a source wiring disposed over the source contact; and (d) a drain contact disposed in a first region located on the other side of the gate electrode over the semiconductor substrate to be electrically coupled to the drain region. The semiconductor device further includes (e) a drain wiring disposed over the drain contact. The drain contact is linearly disposed in the first region to extend in the first direction, and the source contact includes a plurality of separated source contacts arranged at predetermined intervals in the first direction in the second region.

A semiconductor device according to another representative embodiment of the invention disclosed in the present application includes: (a) a laterally diffused MISFET, including: (a1) a gate electrode disposed over a first surface of a semiconductor substrate via a gate insulating film to extend in a first direction; and (a2) a source region disposed in the semiconductor substrate on one side of the gate electrode, and a drain region disposed in the semiconductor substrate on the other side of the gate electrode. The semiconductor device also includes (b) a source contact disposed in a second region located on the one side of the gate electrode over the semiconductor substrate to be electrically coupled to the source region; (c) a source wiring disposed over the source contact; and (d) a drain contact disposed in a first region located on the other side of the gate electrode over the semiconductor substrate to be electrically coupled to the drain region. The semiconductor device further includes (e) a drain wiring disposed over the drain contact. The drain contact includes a plurality of separated drain contacts disposed at first intervals in the first direction in the first region. The source contact includes a plurality of separated source contacts disposed at the first intervals in the first direction in the second region. Each of the separated drain contacts is shifted in the first direction so as to be located between the separated source contacts in the first direction.

A semiconductor device according to a further representative embodiment of the invention disclosed in the present application includes: (a) a laterally diffused MISFET, including: (a1)) a gate electrode disposed over a first surface of a semiconductor substrate via a gate insulating film to extend in a first direction, and (a2) a source region disposed in the semiconductor substrate on one side of the gate electrode, and a drain region disposed in the semiconductor substrate on the other side of the gate electrode. The semiconductor device also includes (b) a source contact disposed in a second region located on the one side of the gate electrode over the semiconductor substrate to be electrically coupled to the source region; (c) a source wiring disposed over the source contact; and (d) a drain contact disposed in a first region located on the other side of the gate electrode over the semiconductor substrate to be electrically coupled to the drain region. The semiconductor device further includes (e) a drain wiring disposed over the drain contact. The drain contact includes a plurality of separated drain contacts disposed at first intervals in the first direction in the first region. The source contact includes a plurality of separated source contacts disposed at first intervals in the first direction in the second region. The respective separated drain contacts are arranged in parallel such that a position of each of the separated drain contacts in the first direction corresponds to a position of each of the respective separated source contacts in the first direction. The drain wiring includes a plurality of separated drain wirings arranged at second intervals in the first direction in the first region.

A semiconductor device according to a still further representative embodiment of the invention disclosed in the present application includes: (a) a laterally diffused MISFET, including: (a1)) a gate electrode disposed over a first surface of a semiconductor substrate via a gate insulating film to extend in a first direction, and (a2) a source region disposed in the semiconductor substrate on one side of the gate electrode, and a drain region disposed in the semiconductor substrate on the other side of the gate electrode. The semiconductor device also includes (b) a source contact disposed in a second region located on the one side of the gate electrode over the semiconductor substrate to be electrically coupled to the source region; and (c) a drain contact disposed in a first region located on the other side of the gate electrode over the semiconductor substrate to be electrically coupled to the drain region. The semiconductor device further includes (d) a drain wiring disposed over the drain contact. The source contact includes a plurality of separated source contacts arranged at predetermined intervals in the first direction in the second region. No source wiring electrically coupled to the source contact is formed over the source contact.

The semiconductor device according to the following representative embodiments of the invention disclosed in the present application can improve its characteristics.

Further, the semiconductor device according to the following representative embodiments of the invention disclosed in the present application can improve its characteristics, while reducing its size.

DETAILED DESCRIPTION

Figure 1:
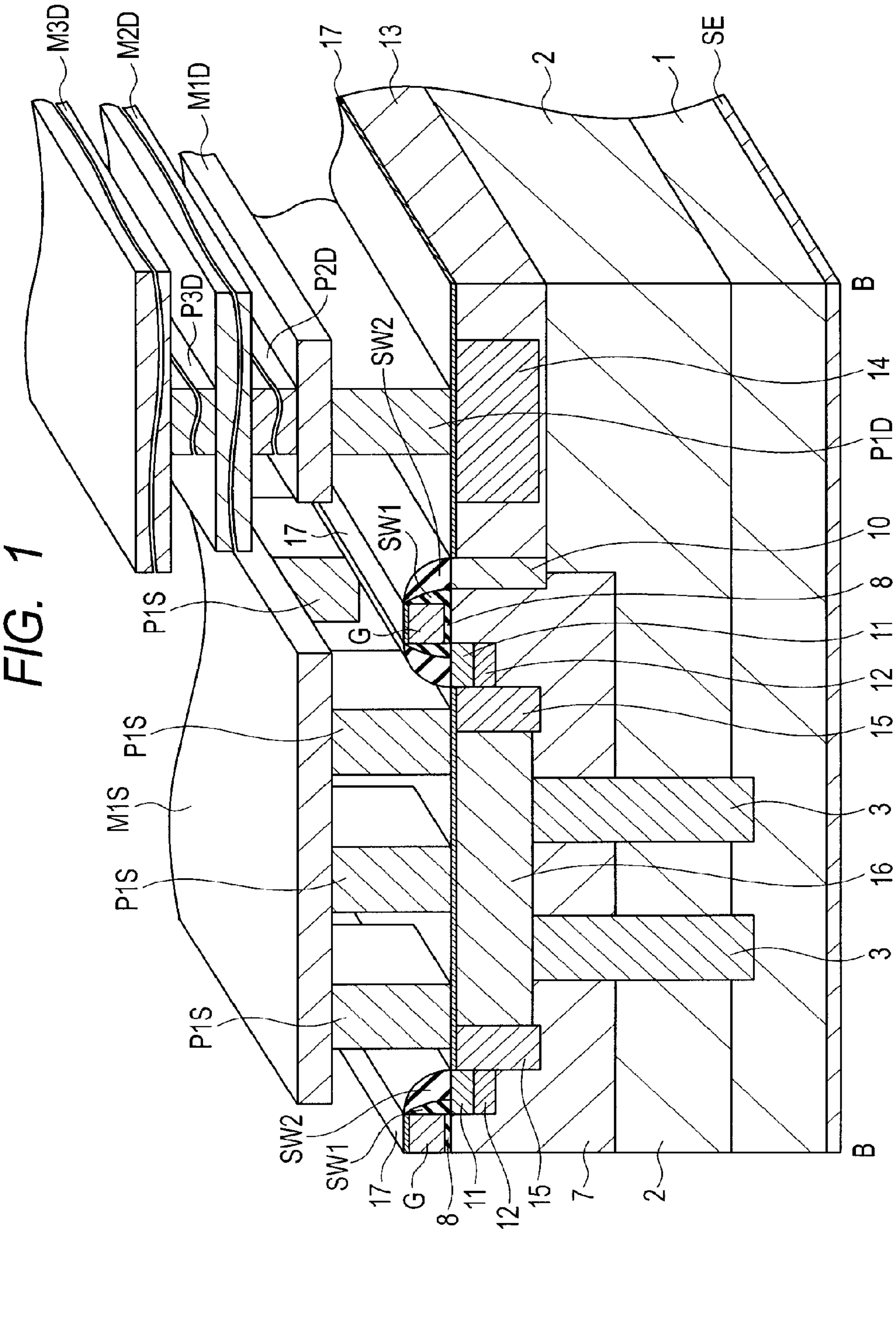
FIG. 1 is a cross-sectional perspective view exemplarily showing the structure of a semiconductor device according to a first embodiment.

The following preferred embodiments may be described below by being separated into a plurality of sections or embodiments for convenience, if necessary, which are not independent from each other except when specified otherwise. One of the sections or embodiments is a modified example, an application example, a detailed explanation, a supplemental explanation, or the like of some or all of the others. When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and except when definitely limited to the specific number in principle.

It is also needless to say that components (including elements or process steps, etc.) employed in the following description of the embodiments are not always essential, unless otherwise specified and except when considered to be definitely essential in principle. Similarly, in the following description of the shapes, positional relations and the like of the components or the like in the embodiments below, they will include those substantially analogous or similar to their shapes or the like, unless otherwise specified and except when considered not to be definitely so in principle, etc. The same goes for the above-mentioned number (including the number of pieces, numerical value, quantity, range, and the like).

Now, preferred embodiments of the invention will be described below in detail based on the accompanying drawings. In all drawings for explanation of the embodiments, members having the same function are designated by the same or related reference character, and thus a repeated description thereof will be omitted below. In the following embodiments, the description of the same or like parts is not repeated in principle if not necessary.

Among the drawings used for the embodiments, some cross-sectional views omit hatching for easy understanding. Also, some plan views make hatching for easy understanding.

First Embodiment

Now, the structure of a semiconductor device and a manufacturing method thereof will be described in detail below with reference to the accompanying drawings.

Description of Structure

Figure 2:
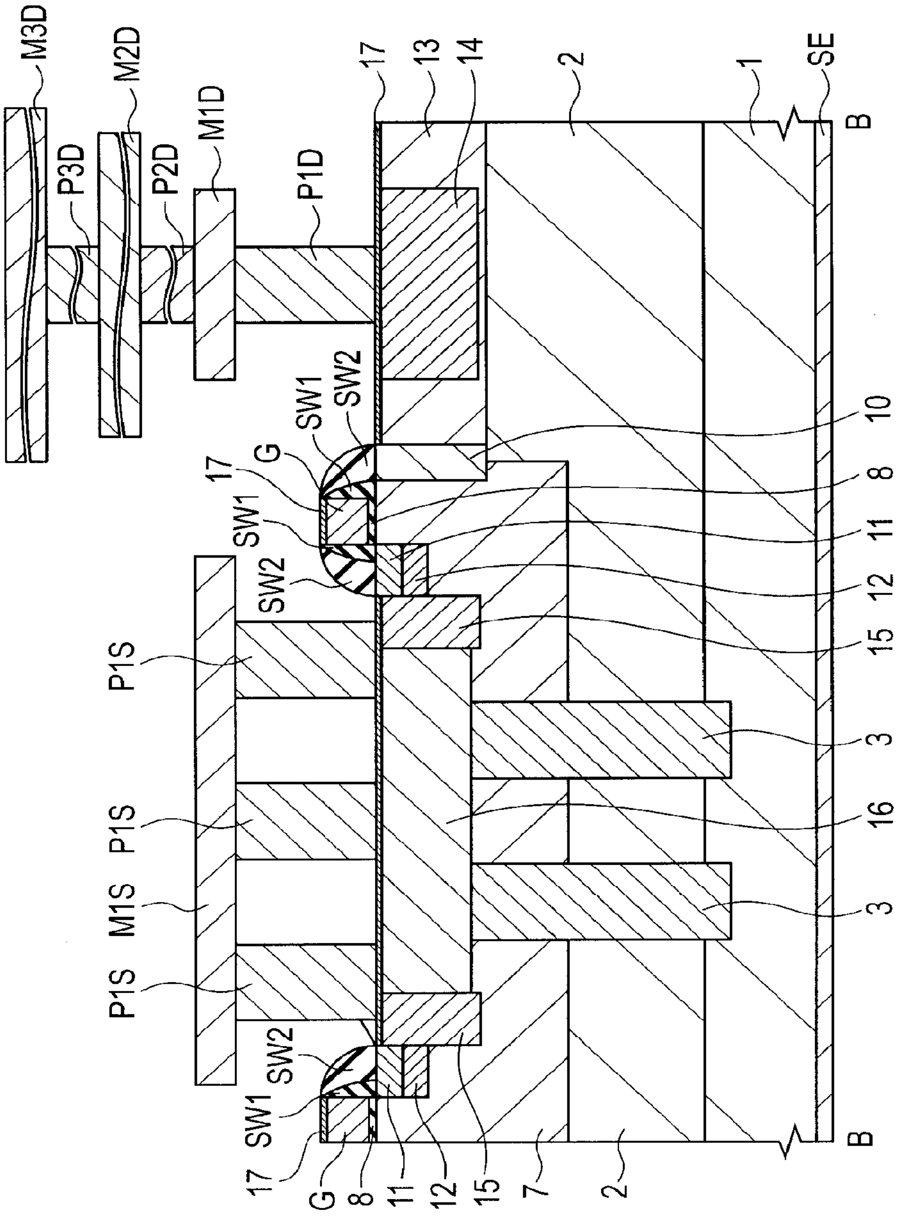
FIG. 2 is a cross-sectional view exemplarily showing the structure of the semiconductor device in the first embodiment.
Figure 3:
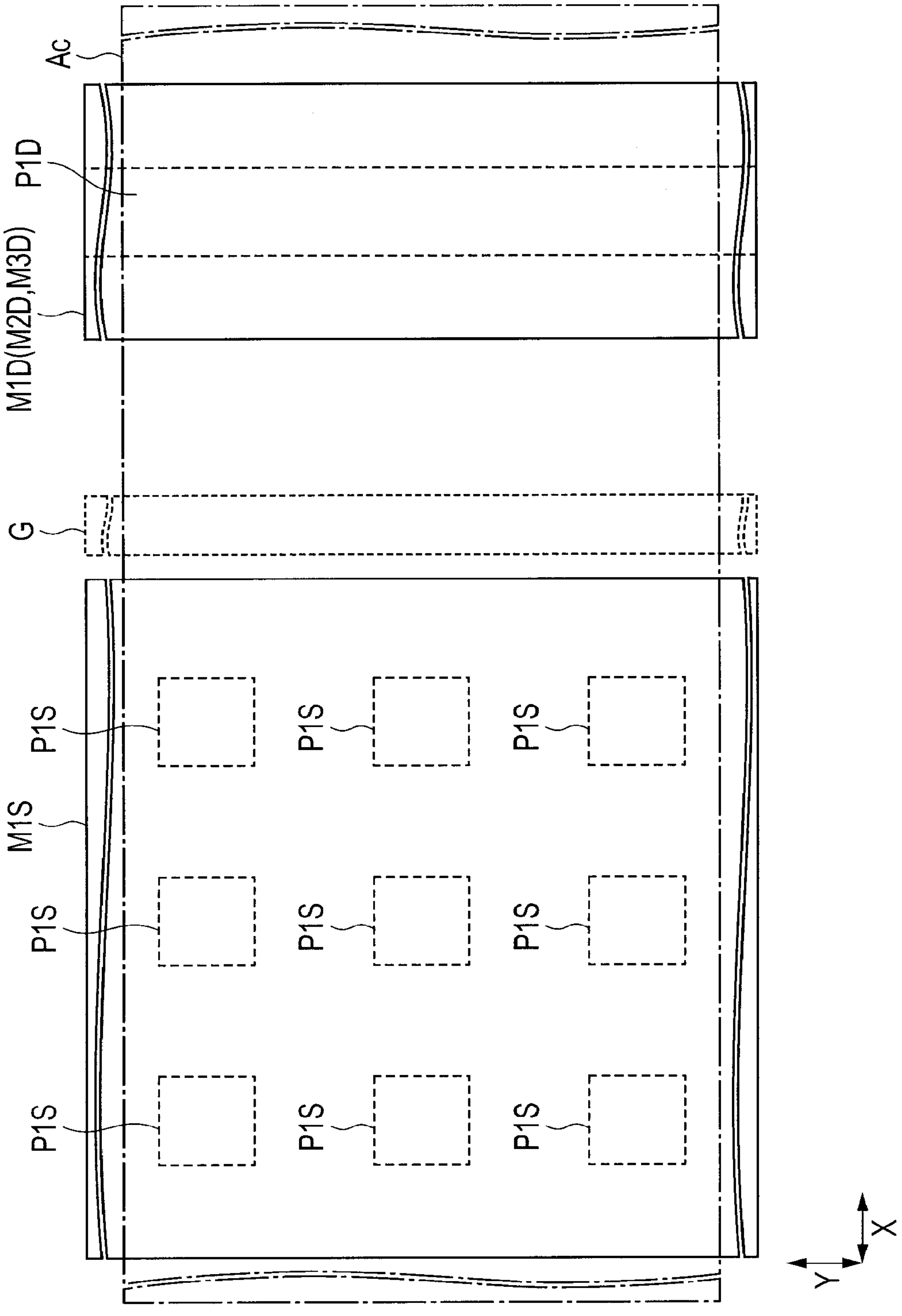
FIG. 3 is a plan view showing a main part of the structure of the semiconductor device in the first embodiment.

FIGS. 1 to 3 are diagrams exemplarily showing the structure of a semiconductor device according to this embodiment. FIG. 1 is a cross-sectional perspective view thereof, FIG. 2 is a cross-sectional view thereof, and FIG. 3 is a plan view of a main part thereof.

The specific structure of the semiconductor device of this embodiment will be described below with reference to FIGS. 1 to 3.

The semiconductor device of this embodiment includes a LDMOS formed over a main surface of an epitaxial layer 2 located over a semiconductor substrate 1.

The LDMOS includes a drain region comprised of a first $n^-$-type drain region 10, a second $n^-$-type drain region 13, and an $n^+$-type drain region 14; a source region comprised of an $n^-$-type source region 11 and an $n^+$-source region 15; and a gate electrode G formed between the source and drain regions (in a channel formation region) via a gate insulating film 8.

The LDMOS is one kind of MOSFET elements, which has the following features (first to third features).

The first feature is that the LDMOS enables a high-voltage operation in a short channel length with a lightly doped drain (LDD) region formed on the drain side of the gate electrode G. That is, the drain of the LDMOS is comprised of the $n^+$-type region ($n^+$-type drain region 14) having a high impurity concentration, and a LDD region (comprised of the first $n^-$-type drain region 10 and the second $n^-$-type drain region 13) having an impurity concentration lower than that of the $n^+$-type region. The $n^+$-type region ($n^+$-type drain region 14) is formed spaced apart from the gate electrode G via the LDD region. This arrangement can achieve a high breakdown voltage. The amount of charges (concentration of impurities) in the LDD region on the drain side and the distance between the end of the gate electrode G and the $n^+$-type drain region (high-concentration drain region) 14 are preferably optimized such that the breakdown voltage of the LDMOS is maximized.

The second feature is that the LDMOS has a p-type well (p-type base region) 7 for a punch through stopper formed in the source region on the source side ($n^-$-type source region 11 and $n^+$-type source region 15) and the channel formation region. On the drain side (in the drain region) of the LDMOS, the p-type well 7 is not formed, or formed so as to be in contact with only a part of the end of the drain region on the side closer to the channel formation region. In short, the drain region (under the drain region comprised of the first $n^-$-type drain region 10, the second $n^-$-type drain region 13, and the $n^+$-type drain region 14) has an area where the p-type well 7 is not formed. In other words, the p-type well 7 is not formed at least under the $n^+$-type drain region 14 forming the drain.

The third feature is that in the LDMOS, the source region ($n^-$-type source region 11 and $n^+$-type source region 15) and the drain region (first $n^-$-type drain region 10, second $n^-$-type drain region 13, and $n^+$-type drain region 14) are asymmetric with respect to the gate electrode G.

Particularly, in the LDMOS, the distance between the $n^+$-type source 15 forming the source region and the end on the source region side of the gate electrode G (hereinafter referred to as a "DS"), and the distance between the $n^+$-type drain region 14 forming the drain and the end on the drain region side of the gate electrode G (hereinafter referred to as a "DD") are asymmetric and thus has the following relationship: DS<DD.

Next, the shape of a pattern (shape in the planar view from an upper surface) of each of the drain region, the source region, and the gate electrode G forming the above LDMOS will be described below.

As shown in FIG. 3, the gate electrode G extends in the direction Y. The gate electrode G is disposed such that the source region extends in the direction Y in the region positioned on one side of the gate electrode G (on the left side of the gate electrode G in FIG. 3, or in the first region). Further, the gate electrode G is disposed such that the drain region extends in the direction Y in the region positioned on the other side of the gate electrode G (on the right side of the gate electrode G in FIG. 3, or in the second region).

A metal silicide layer 17 is formed over the drain region, source region, and gate electrode G forming the above LDMOS (see FIG. 1 and the like).

Although not shown in FIG. 3, as shown in FIG. 1, the source region is electrically coupled to source plugs P1S via the metal silicide layer 17. The drain region ($n^+$-type drain region 14) is electrically coupled to the drain plug P1D via the metal silicide layer 17. Although not shown in FIG. 1, the gate electrode G is electrically coupled to a gate plug P1G via the metal silicide layer 17 (see FIG. 9).

The drain plug P1D is formed in the region positioned on one side of the gate electrode G (on the right side of the gate electrode G in FIG. 3), and the source plug P1S is formed in the region positioned on the other side of the gate electrode G (on the left side of the gate electrode G in FIG. 3).

As shown in FIG. 3, the drain plug P1D is linearly formed to extend in the direction Y. In other words, the drain plug P1D has a rectangular pattern shape (shape in the planar view from an upper surface) having a long side extending in the direction Y.

The source plug P1S is comprised of a plurality of separated source plugs (separated source contacts) P1S. That is, the separated source plugs P1S each having the square pole shape are arranged in the array in the directions X and Y. In other words, the shape of the pattern (shape in the planar view from an upper surface) of the separated source plugs P1S is rectangular. The separated source plugs P1S are disposed at predetermined intervals in the direction Y. The separated source plugs P1S arranged in the direction Y are hereinafter referred to as a separated source plug column. Referring to FIG. 3, three columns of separated source plugs are disposed in the direction X at predetermined intervals in the region on the left side of the gate electrode G. In the present specification, the "source plug" and the "separated source plug" are designated by the same reference character "P1S". Unless otherwise specified, the term "source plug" means all of the separated source plugs P1S.

As shown in FIGS. 1 and 2, the drain wiring M1D is disposed over the drain plug P1D, and the source wiring M1S is disposed over the source plugs P1S. Although not shown in FIGS. 1 and 2, the gate wiring M1G is disposed over the gate plug P1G (see FIG. 9). As shown in FIG. 3, the drain wiring M1D is linearly disposed to extend in the direction Y so as to cover the drain plug P1D. The source wiring M1S is linearly disposed to extend in the direction Y so as to cover the separated source plugs P1S. The drain wiring M1D, the source wiring M1S, and the gate wiring M1G serve as a first layer wiring.

As shown in FIGS. 1 and 3, the drain wiring M1D is coupled to the drain wiring M2D serving as a second layer wiring via a drain plug P2D. The drain wiring M2D is coupled to a drain wiring M3D serving as a third layer wiring via a drain plug P3D.

Figure 27:
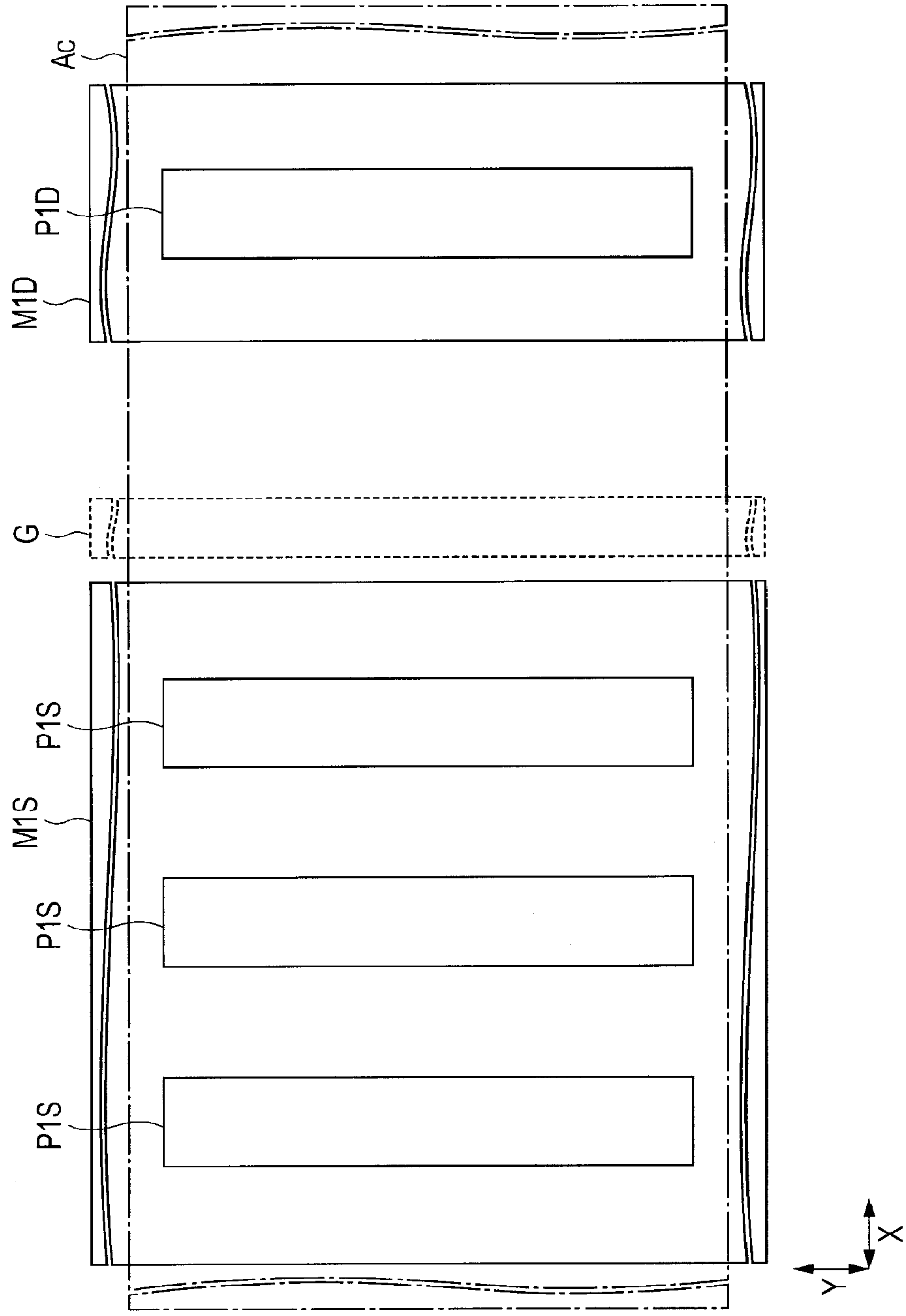
FIG. 27 is a plan view showing a main part of the structure of a semiconductor device in a comparative example.

In this embodiment, the source plug P1S is not shaped linearly, unlike the drain plug P1D, and is comprised of the separated source plugs P1S, which can decrease an area where the source plugs P1S are opposed to the drain plug P1D. FIG. 27 shows a plan view of a semiconductor device in which source plugs P1S are linearly formed like the drain plug P1D, as a comparative example.

Thus, by decreasing the opposed area between the source plugs P1S and the drain plug P1D, the parasitic capacitance between the source plug P1S and the drain plug P1D can be reduced. Likewise, the parasitic capacitance between the source plug P1S and the drain wiring M1D can be reduced. Also, the parasitic capacitance between the source plugs P1S and other wirings (M2D, M3D, and the like) can be reduced.

As a result, the power amplification circuit or the like using the LDMOS of this embodiment can improve the characteristics of a circuit, specifically, the power efficiency. Thus, the characteristics or performance of the semiconductor device can be improved.

Description of Manufacturing Method

Referring now to FIGS. 4 to 16, a manufacturing method of the semiconductor device in this embodiment will be described below, while clarifying the structure of the semiconductor device. FIGS. 4 to 16 are cross-sectional views or plan views showing main parts of the manufacturing steps of the semiconductor device in this embodiment. The cross-sectional view of the main part corresponds to, for example, a cross-sectional view taken along the line B-B of the plan view of the main part.

Figure 4:
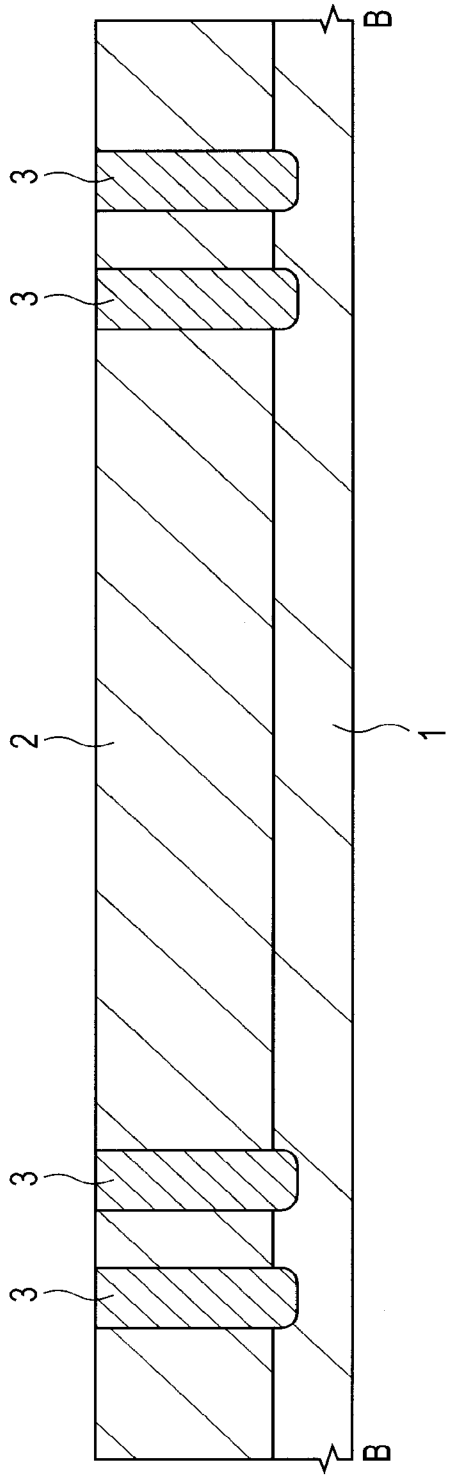
FIG. 4 is a cross-sectional view showing a main part of a manufacturing step of the semiconductor device in the first embodiment.

First, the manufacturing steps will be described below based on FIGS. 4 and 5. As shown in FIG. 4, a semiconductor substrate 1 (hereinafter simply referred to as a "substrate") formed of, for example, a $p^+$-type silicon (Si) single crystal and having a low resistivity (specific resistance) of, for example, about 1 to 10 mΩcm is prepared. Then, an epitaxial layer (semiconductor layer) 2 is formed of p-type single crystal silicon over a main surface of the substrate (semiconductor substrate, or semiconductor wafer) 1 by the known epitaxial growth method, for example, in a thickness of about 2 μm so as to have a resistivity of about 20 Ωcm. The epitaxial layer 2 is a semiconductor layer. The concentration of impurities of the epitaxial layer 2 is lower than that of the substrate 1. The resistivity of the epitaxial layer 2 is higher than that of the substrate 1. The combination of the substrate 1 and the epitaxial layer 2 can be regarded as the semiconductor substrate.

Then, a part of the epitaxial layer 2 is etched using the photolithography and dry-etching to form trenches reaching the substrate 1. Subsequently, a p-type polycrystal silicon film is deposited over the epitaxial layer 2 containing the insides of the trenches by a chemical vapor deposition (CVD) method or the like, and then a part of the p-type polycrystal silicon film outside the trenches is removed by an etching back method or the like. Thus, a p-type embedded layer (sinker, p-type semiconductor layer) 3 is formed of the p-type polycrystal silicon film embedded in each trench. Each p-type embedded layer 3 penetrates the epitaxial layer 2, so that the bottom of the p-type embedded layer 3 reaches the substrate 1.

Figure 5:
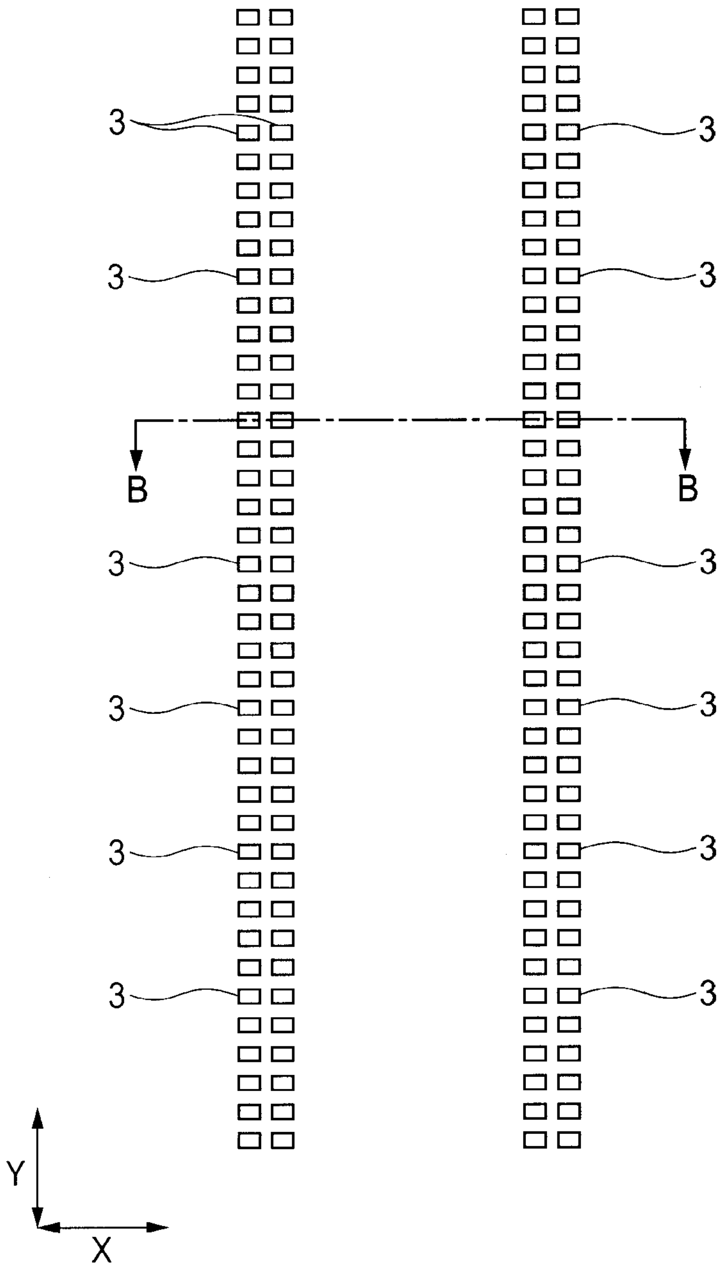
FIG. 5 is a plan view showing a main part of the manufacturing step of the semiconductor device in the first embodiment.

As shown in FIG. 5, the two p-type embedded layers 3 are provided close to each other to make a pair of embedded layers. A plurality of the pairs are disposed at predetermined intervals in the direction Y to form opposed columns of the p-type embedded layers 3. FIG. 5 illustrates two columns of these pairs.

In this way, the p-type embedded layers 3 having a small parasitic resistance can be formed by filling the trenches with the p-type polycrystal silicon film doped with impurities in a high concentration. Thus, the concentration of impurities of the p-type embedded layer 3 is higher than that of the impurities of the epitaxial layer 2, and the resistivity of the p-type embedded layer 3 is lower than that of the epitaxial layer 2. Alternatively, the embedded layer having a small parasitic resistance may be formed by filling each trench with a metal film instead of the polycrystal silicon film.

Then, element isolation regions are formed of an insulator at the main surface of the epitaxial layer 2, for example, by a shallow trench isolation (STI) method or a local oxidization of silicon (LOCOS) method. The element isolation region is not shown in FIGS. 4 and 5. For example, trenches are formed in the epitaxial layer 2 by etching and an insulating film, such as a silicon oxide film, is embedded in each trench, so that the element isolation regions can be formed in the epitaxial layer 2. The formation of the element isolation regions define an active region Ac with a cell of the LDMOS formed therein, at the main surface of the substrate 1 (at the main surface of the epitaxial layer 2) (see FIG. 3). The active region Ac is a region enclosed by the element isolation regions.

Figure 6:
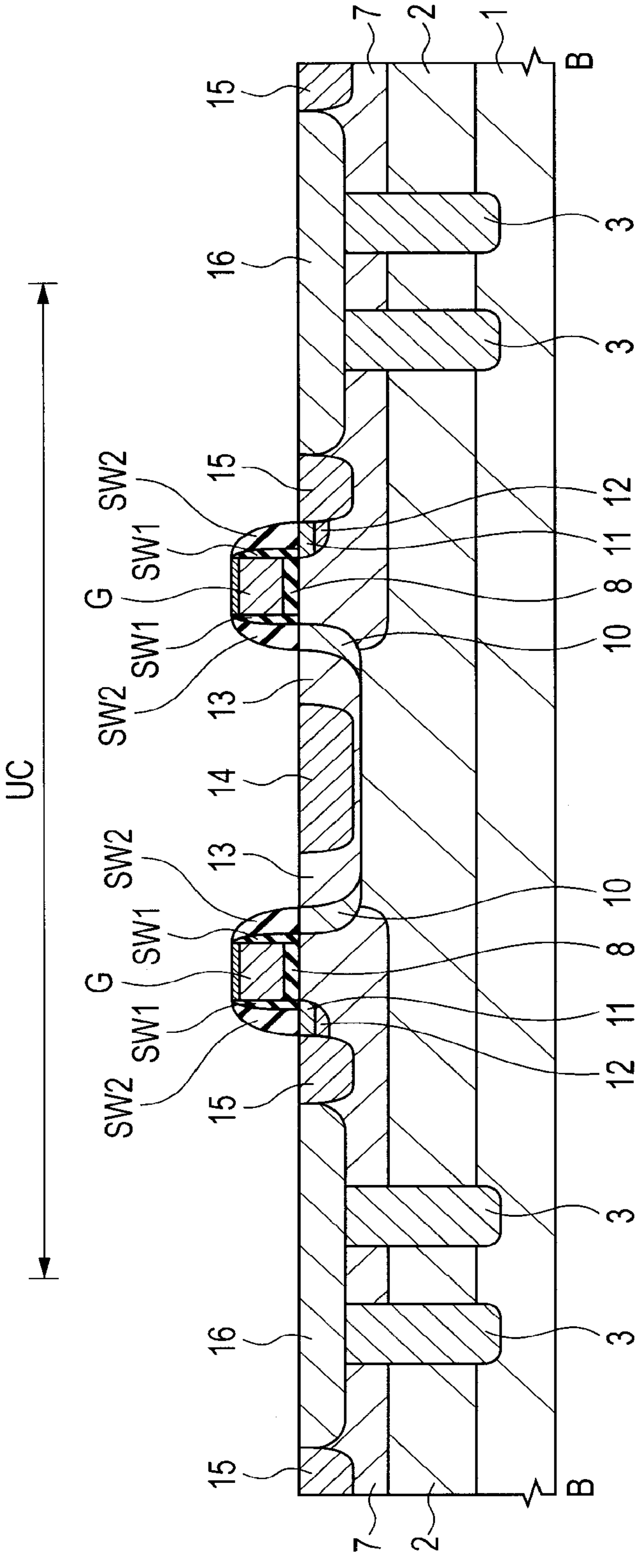
FIG. 6 is a cross-sectional view showing a main part of another manufacturing step of the semiconductor device in the first embodiment, following the step shown in FIG. 4.

Then, the following steps will be described below based on FIGS. 6 and 7. As shown in FIG. 6, p-type impurities, such as boron (B), are ion-implanted into parts of the epitaxial layer 2 using a photoresist film (not shown) in a predetermined shape as an ion implantation interrupting mask, so that p-type wells (p-type base regions, p-type semiconductor regions) 7 for the punch through stopper are formed. The p-type well 7 serves as the punch through stopper for suppressing the extension of a depletion layer from the drain region of the LDMOS to the source region thereof. The p-type well 7 is mainly formed of a source region and a channel formation region of the LDMOS. The p-type well 7 is also used for adjustment of a threshold of the LDMOS.

Then, after cleaning the surface of the epitaxial layer 2 by a hydrofluoric acid or the like, the substrate 1 is subjected to the heat treatment (thermal oxidation process) for example, at about 800° C., so that the gate insulating film 8 is formed of a silicon oxide film or the like over the surface of the epitaxial layer 2, for example, in a thickness of about 11 nm. The gate insulating film 8 may be a silicon oxide film containing nitrogen, which is the so-called oxynitride film, instead of a thermally-oxidized film. A silicon oxide film may be deposited over the thermally-oxidized film by the CVD method, whereby two layers of these oxide films may form the gate insulating film 8.

Then, the gate electrode G is formed over a gate insulating film 8. In order to form the gate electrode G, for example, an n-type polycrystal silicon film (doped polycrystal film) is deposited over the main surface of the epitaxial layer 2 (that is, the gate insulating film 8) by the CVD method or the like, and patterned by the photolithography and dry-etching. Thus, the gate electrode G formed of the patterned n-type polycrystal silicon film is formed over the surface of the p-type well 7 via the gate insulating film 8.

Then, n-type impurities, such as arsenic (As), are ion-implanted into a part of the surface of the p-type well 7 using the photoresist film (not shown) in a predetermined shape as an ion implantation interrupting mask to thereby form the $n^-$-type source region 11. The $n^-$-type source region 11 is formed in a self-alignment manner with the gate electrode G. The ion implantation is performed at a low acceleration energy to thereby form the shallow $n^-$-type source region 11, which can suppress the diffusion of impurities from the source region to the channel formation region. Thus, the reduction in threshold voltage can be suppressed.

Then, a sidewall spacer (sidewall insulating film) SW1 is formed of an insulating film, such as a silicon oxide film, at each sidewall of the gate electrode G. The sidewall spacer SW1 can be formed, for example, by depositing an insulating film, such as a silicon oxide film, over the substrate 1 by the CVD method or the like, and applying the anisotropic etching to the insulating film. Then, n-type impurities, such as phosphorus (P), are ion-implanted into a part of the epitaxial layer 2 using a photoresist film (not shown) having openings at an upper part of the drain region as an ion implantation interrupting mask to thereby form a first $n^-$-type drain region (first low concentration n-type drain region, and first n-type lightly doped drain (LDD) region) 10. The first $n^-$-type drain regions 10 are formed in a self-alignment manner with the sidewall spacers SW1. By decreasing the concentration of impurities of the first $n^-$-type drain region 10, the depletion layer between the gate electrode G and the drain expands to thereby reduce a feedback capacity (parasitic capacitance between the drain and gate electrode, namely, Cgd) formed therebetween.

Then, p-type impurities, such as boron (B), are ion-implanted into the p-type well 7 using a photoresist film (not shown) in the predetermined shape as an ion implantation interrupting mask to thereby form a p-type halo 12 under each $n^-$-type source region 11. At this time, the impurities are obliquely ion-implanted at an angle of 30 degrees with respect to the main surface of the substrate 1. The p-type halo region 12 is not necessarily formed. The formation of the halo region further suppresses the diffusion of the impurities from the source region into the channel formation region, and suppresses the short-channel effect. Further, the reduction of threshold voltage can be suppressed.

Then, a sidewall spacer (sidewall insulating film) SW2 is formed of an insulating film, such as a silicon oxide silicon film, at each sidewall of the gate electrode G (sidewall spacer SW1). The sidewall spacer SW2 can be formed, for example, by depositing an insulating film, such as a silicon oxide film, over the substrate 1 by the CVD method or the like, and applying the anisotropic etching to the insulating film. Then, n-type impurities, such as phosphorus (P), are ion-implanted into a part of the first $n^-$-type drain region 10 using a photoresist film (not shown) having openings at an upper part of the drain region as an ion implantation interrupting mask. Thus, a second $n^-$-type drain region (second low concentration n-type drain region, or second n-type lightly doped drain (LDD) region) 13 is formed in a part of the first $n^-$-type drain region 10 in a self-alignment manner with the sidewall spacers SW1 and SW2 formed at the sidewall on the drain side of the gate electrode G.

Since the impurities implanted in the formation step of the second $n^-$-type drain region 13 are of the same conduction type (P) in the formation step of the first $n^-$-type drain region 10, the concentration of impurities of the second $n^-$-type drain region 13 is higher than that of the first $n^-$-type drain region 10. That is, the second $n^-$-type drain region 13 has a resistance lower than that of the first $n^-$-type drain region 10, and thus can reduce the on resistance (Ron).

The first $n^-$-type drain region 10 is formed in a self-alignment manner with the sidewall spacer SW1 at the sidewall of the gate electrode. The second $n^-$-type drain region 13 is formed in a self-alignment manner with the sidewall spacer SW2 at the sidewall of the gate electrode G. The second $n^-$-type drain region 13 is formed spaced apart from the gate electrode G in a thickness corresponding to the thickness of the sidewall spacers SW1 and SW2 along the gate length direction. Thus, even the high concentration of impurities of the second $n^-$-type drain region 13 hardly affects the feedback capacity (Cgd). The acceleration energy of ion implantation in forming the second $n^-$-type drain region 13 is at the same level as that of ion implantation in forming the first $n^-$-type drain region 10, whereby the junction depth of the second $n^-$-type drain region 13 is substantially the same as that of the first $n^-$-type drain region 10.

Then, n-type impurities, such as arsenic (As), are ion-implanted into a part of the second $n^-$-type drain region 13 and the p-type well 7 of the source region using a photoresist film (not shown) having openings at each of a part of the second $n^-$-type drain region 13 and an upper part of the p-type well 7 of the source region as an ion implantation interrupting mask.

An $n^+$-type drain region (high concentration drain region, or high concentration n-type drain region) 14 is formed in a part of the second $n^-$-type drain region 13 by ion implantation. The $n^+$-type drain region 14 has an impurity concentration higher than that of the second $n^-$-type drain region 13. The $n^+$-type drain region 14 is spaced apart from the channel formation region as compared to the second $n^-$-type drain region 13. At this time, the $n^+$-type drain region 14 having the high concentration of impurities is formed more shallowly than the second $n^-$-type drain region 13 or first $n^-$-type drain region 10 having a low concentration of impurities.

An $n^+$-type source region 15 is formed in the p-type well 7 by ion implantation. The $n^+$-type source region 15 has an impurity concentration higher than that of the $n^-$-type source region 11. The $n^+$-type source region 15 has a bottom deeper than the $n^-$-type source region 11. The $n^+$-type source region 15 is formed in a self-alignment manner with the sidewall spacer SW2 at the sidewall of the gate electrode G. Thus, the $n^+$-type source region 15 is spaced apart from the channel formation region by a thickness of each of the sidewall spacers SW1 and SW2 along the gate length direction.

In this way, the low concentration n-type drain region (n-type LDD region) intervening in between the gate electrode G and the $n^+$-type drain region 14 has a double-layered structure. The concentration of impurities of the first $n^-$-type drain region 10 closest to the gate electrode G is relatively low, and the concentration of impurities of the second $n^-$-type drain region 13 spaced apart from the gate electrode G is relatively high. The depletion layer is diffused between the gate electrode G and the drain. This results in a decrease in feedback capacity (Cgd) generated between the gate electrode G and the first n-type drain region 10 in the vicinity of the gate electrode G. The on resistance (Ron) also becomes small because of the high concentration of impurities of the second $n^-$-type drain region 13. The second $n^-$-type drain region 13 is formed in the position apart from the gate electrode G, which hardly affects the feedback capacity (Cgd). This arrangement can decrease the on resistance (Ron) and the feedback capacity (Cgd), and thus can improve the efficiency of application of the power of the amplification circuit.

Until this step, the LDMOS is formed over the main surface (active region) of the epitaxial layer 2. The LDMOS includes the drain region comprised of the first $n^-$-type drain region 10, the second $n^-$-type drain region 13, and the $n^+$-type drain region 14, the source region comprised of the $n^-$-type drain region 11 and the $n^+$-type source region 15, and the gate electrode G.

In the present application, the term "MOSFET" is used for convenience. The term "MOSFET" as used in the present application includes not only a MOSSFET using an oxide film (silicon oxide film) as a gate insulating film, but also a MISFET (metal-insulator-semiconductor field effect transistor) using an insulating film other than the oxide film (silicon oxide film) as a gate insulating film.

Then, p-type impurities, such as a boron fluoride ($BF_2$), are ion-implanted into the surface of the substrate 1 near the p-type embedded layer 3 using a photoresist film (not shown) having the openings at the upper part of the p-type embedded layer 3 as an ion implantation interrupting mask, so that $p^+$-type semiconductor regions 16 are formed above the p-type embedded layer 3. The $p^+$-type semiconductor regions 16 are formed above the p-type embedded layers 3, which can reduce the resistance of the surface of the p-type embedded layer 3.

Until this step, the structure shown in FIG. 6 is obtained.

Figure 7:
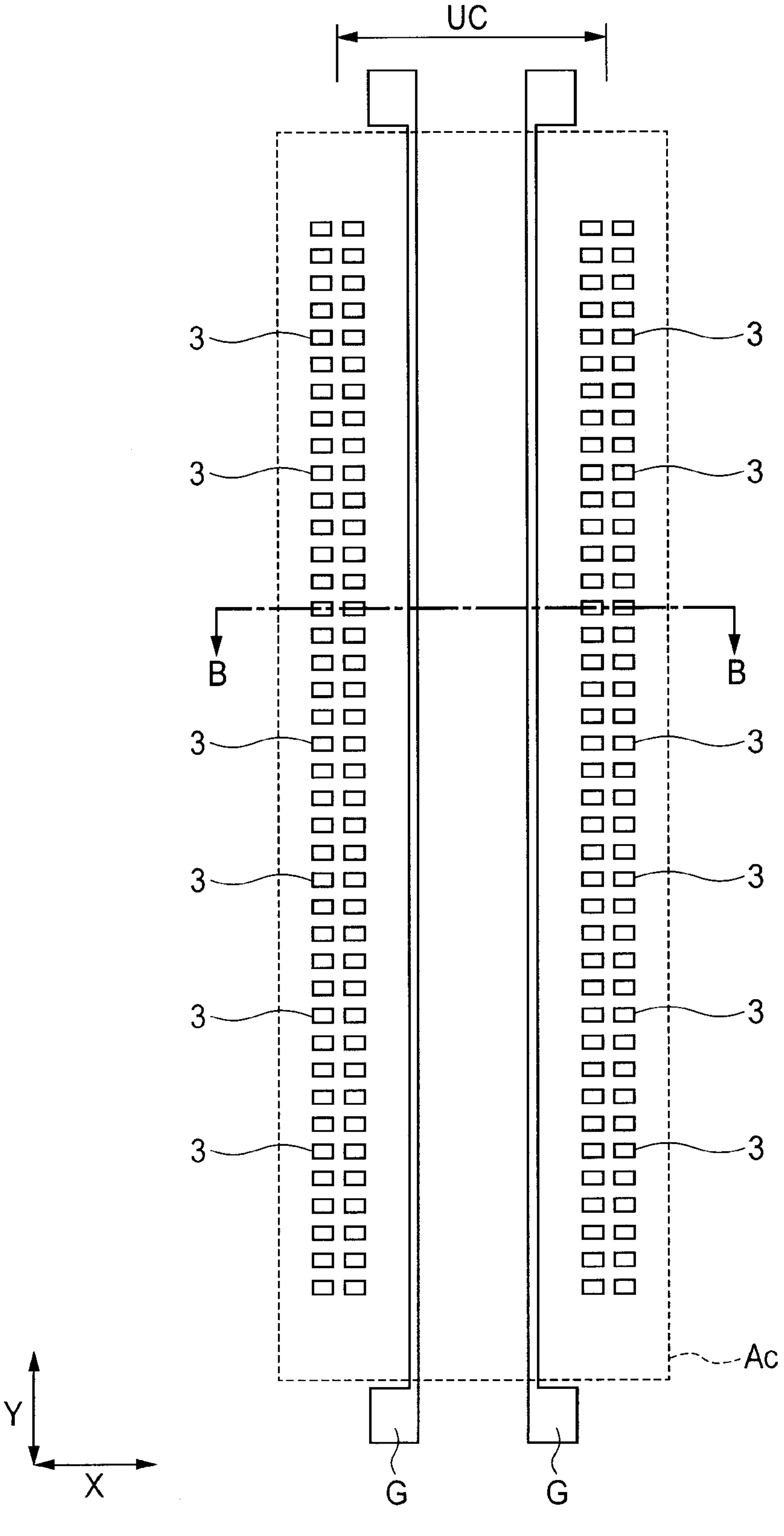
FIG. 7 is a cross-sectional view showing a main part of another manufacturing step of the semiconductor device in the first embodiment, following the step shown in FIG. 5.

FIG. 7 shows a plan view of a main part corresponding to the stage of the step shown in FIG. 6. As shown in FIG. 7, the gate electrode G of the LDMOS extends in the direction Y. Although not shown in FIG. 7, the drain region of the LDMOS (first $n^-$-type drain region 10, second $n^-$-type drain region 13, and $n^+$-type drain region 14) is formed in the active region between the adjacent gate electrodes G to extend in the direction Y. The source region ($n^-$-type source region 11 and $n^+$-type source region 15) of the LDMOS is formed in the active region on the side opposite to the drain region of the gate electrode G to extend in the direction Y. Each p-type embedded layer 3 is formed between the $n^+$-type source regions 15 (not shown in FIG. 7) of the adjacent LDMOSs. Although not shown in FIG. 7, the $p^+$-type semiconductor region 16 is formed between the $n^+$-type source regions 15 of the adjacent LDMOSs to extend in the direction Y.

Figure 16:
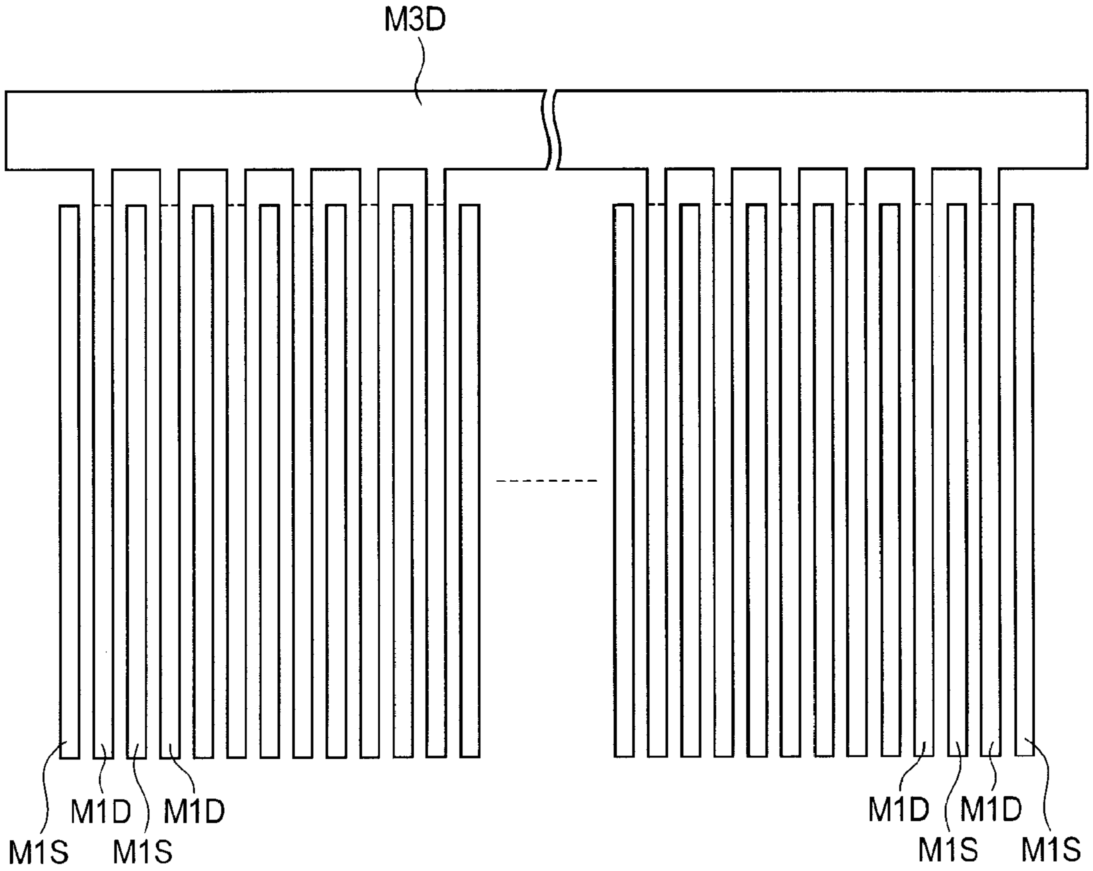
FIG. 16 is a plan view showing a main part of a repeated structure of LDMOSs in the first embodiment.

In the LDMOS formation region (active region), the structure (layout) of a unit cell (which is a repeating unit, a basic cell, a unit region, or a unit cell for the LDMOS) corresponding to the region UC shown in FIGS. 6 and 7 is repeated in the direction X (see FIG. 16). One unit cell is comprised of two LDMOS portions (that is, two gate electrodes G). That is, the unit cell is comprised of two LDMOS portions which are symmetric to each other in the direction X, sharing the $n^+$-type drain region 14. Since the LDMOS is a MISFET element, one LDMOS portion can also be regarded as a MISFET element unit.

In this way, the unit cell is repeatedly arranged in the direction X. That is, the LDMOS portions are coupled together in parallel. The parallel coupling is made by a gate wiring M1G, a source backside electrode SE, drain wirings (M1D, M2D, and M3D), plugs (P1D, P1G, P2D, and P3D), and the like as will be described later.

The following description will be given based on FIGS. 8 to 10. First, a compound layer containing a semiconductor and a metal is formed over the surfaces (upper surfaces or upper parts) of the source region ($n^-$-type source region 11 and $n^+$-type source region 15), the drain region (first $n^-$-type source region 10, second $n^-$-type drain region 13, and $n^+$-type drain region 14), the $p^+$-type semiconductor region 16, and the gate electrode G. The metal silicide layer 17 is formed of, for example, cobalt silicide. The metal silicide layer 17 can be formed, for example, as follows. A cobalt (Co) film (not shown) is formed over the entire main surface of the substrate 1 as a metal film, and then the substrate 1 is subjected to the heat treatment, which causes the above metal film to react with the source region ($n^-$-type source region 11 and $n^+$-type source region 15), the drain region (first $n^-$-type drain region 10, second $n^-$-type drain region 13, and $n^+$-type drain region 14), the $p^+$-type semiconductor region 16, and a silicon (semiconductor film) forming the gate electrode G. Thus, the metal silicide layer 17 is formed over each of the source region ($n^-$-type source region 11 and $n^+$-type source region 15), the drain region (first $n^-$-type drain region 10, second $n^-$-type drain region 13, and $n^+$-type drain region 14), the $p^+$-type semiconductor region 16, and the gate electrode G. The metal film can be formed, for example, by sputtering or the like. Then, an unreacted part of the metal film is removed. The metal silicide layer 17 is not necessarily formed over all of the drain region (first $n^-$-type drain region 10, second $n^-$-type drain region 13, and $n^+$-type drain region 14), the $p^+$-type semiconductor region 16, and the gate electrodes G. For example, the above metal silicide layer 17 may not be formed over a part of the above regions. In this case, for example, a silicide oxide film or the like is formed over a region not to be silicided, which can prevent the above silicide reaction. The metal silicide layer 17 is preferably formed over the source region ($n^-$-type source region 11 and $n^+$-type source region 15), and the $p^+$-type semiconductor region 16. Such a metal silicide layer 17 can achieve the reduction in resistance of the source region. The connection resistance between the source region and the source plug P1S to be described later can be reduced.

Then, an insulating film (interlayer insulating film) 21 is formed over the substrate 1 by the CVD method or the like. The insulating film 21 is a laminated film comprised of a relatively thin silicon nitride film and a relatively thick silicon oxide film thereon. If necessary, the surface of the insulating film 21 is planarized using a chemical mechanical polishing (CMP) method or the like.

Then, contact holes (through holes) are formed in the insulating film 21 by dry-etching the insulating film 21 using a photoresist film (not shown) in a predetermined shape as an etching mask, whereby a conductive film including a tungsten (W) film as a principal component is embedded in each contact hole to thereby form plugs (contacts, contact portions, coupling portions, or conductors for coupling, namely, P1S, P1D, or P1G). For example, after forming a barrier film, such as a titanium nitride film, over the insulating film 21 including the inside of each contact hole, a tungsten film is formed over the barrier film to fill the contact holes. Unnecessary parts of the tungsten film and barrier film over the insulating film 21 are removed by the CMP method or the etching back method, whereby the plugs (P1S, P1D, and P1G) can be formed.

Figure 8:
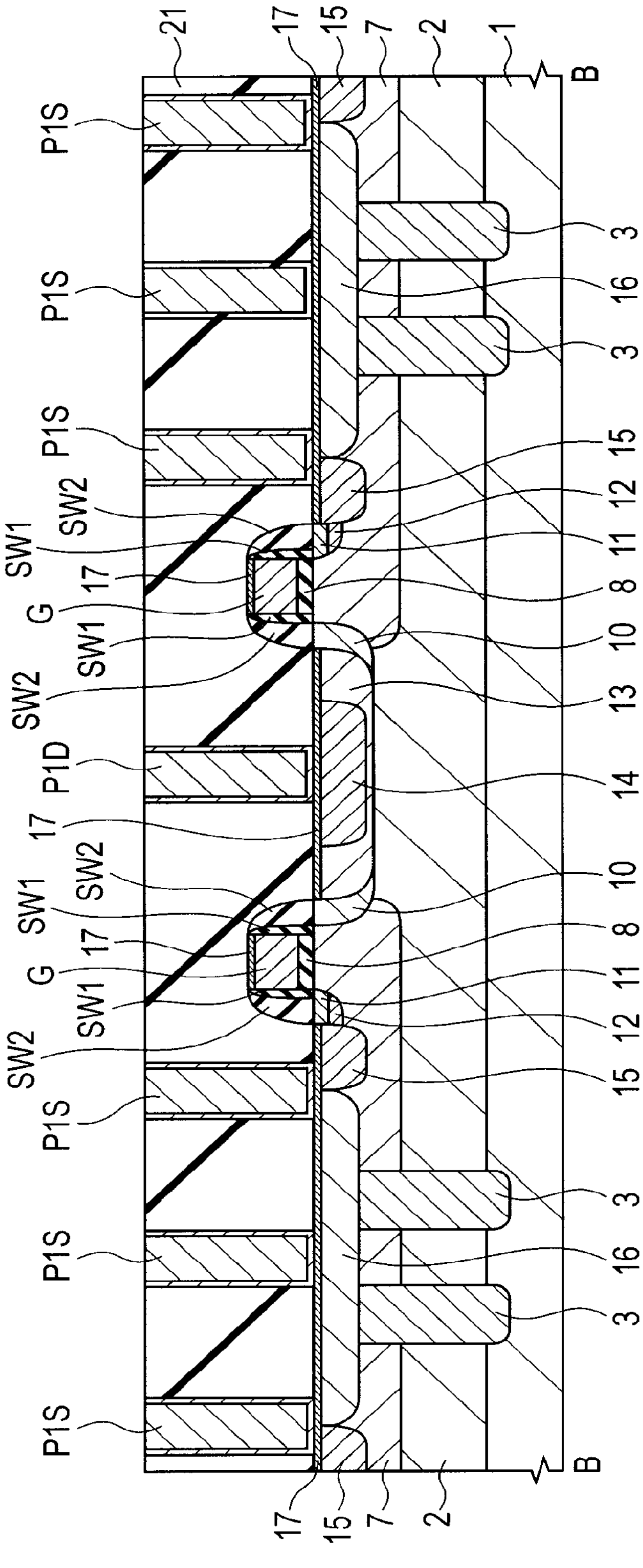
FIG. 8 is a cross-sectional view showing a main part of another manufacturing step of the semiconductor device in the first embodiment, following the step shown in FIG. 6.

Until this step, the structure shown in FIG. 8 is obtained. FIG. 9 is a plan view of a main part corresponding to the stage of the step shown in FIG. 8. FIG. 10 corresponds to, for example, an enlarged view of a region enclosed by a dashed-dotted line shown in FIG. 9 (note that the same goes for FIGS. 13, and 18 to 27). As shown in FIGS. 9 and 10, the plug (P1) includes the source plug (source contact) P1S formed in the source region, the drain plug (drain contact) P1D formed in the drain region, and the gate plug (gate contact) P1G formed over the gate electrode G.

The source plug P1S is formed in the source region comprised of the $n^+$-type source region 15 and the $p^+$-type semiconductor region 16. The drain plug P1D is formed in the drain region comprised of the first $n^-$-type drain region 10, the second $n^-$-type drain region 13, and the $n^+$-type drain region 14. The gate plug P1G is formed over the gate electrode G.

The drain plug P1D is linearly formed to extend in the direction Y, corresponding to the drain region extending in the direction Y.

In contrast, the source plug P1S is disposed and separated into a plurality of parts over the source region extending in the direction Y. As shown in FIG. 9, the source plug P1S is comprised of three columns of separated source plugs P1S, and the column of the separated source plug P1S extends in the direction Y. The separated source plugs P1S, each of which is a square pole having a substantially square pattern shape (shape in a planar view from the upper surface), are disposed at predetermined intervals in the directions X and Y. For example, the pattern shape (shape in the planar view from the upper surface) of each of the separated source plugs P1S is a square having each side of 0.35 pin in length. The separated source plugs P1S are disposed at about 0.45 μm intervals (first interval) in the directions X and Y. The pattern shape (shape in the planar view from the upper surface) of each separated source plug P1S is not limited thereto. The source plugs P1S are disposed at different intervals between the directions X and Y. For example, one side of the pattern shape of the separated source plug P1S is about 0.2 to 1 μm, and the interval in the direction X and in the direction Y can be set to about 0.2 to 1 μm.

In this embodiment, the source plug P1S is comprised of the separated source plugs P1, which can reduce the parasitic capacitance as will be described in detail later.

Figure 9:
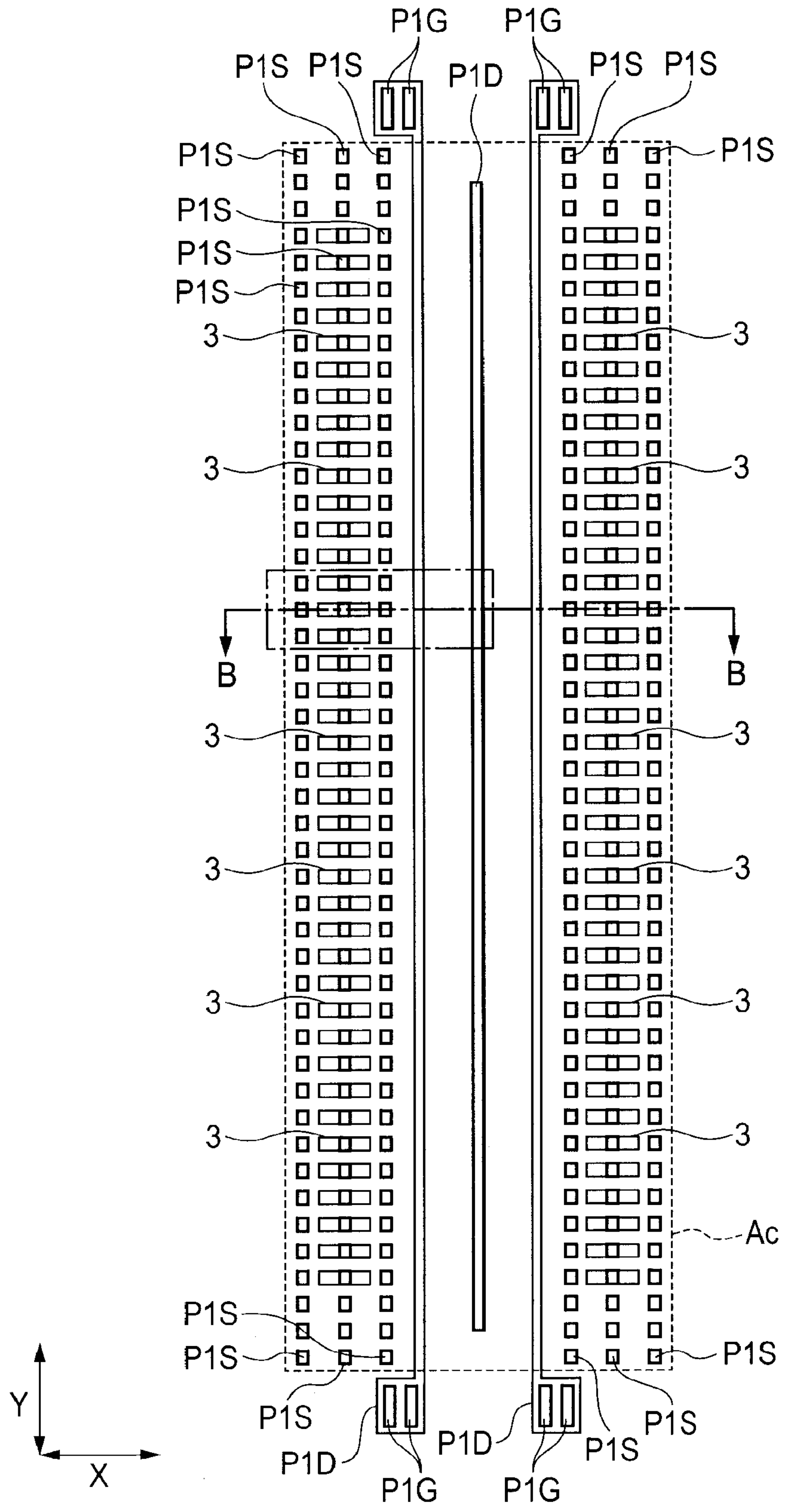
FIG. 9 is a cross-sectional view showing a main part of another manufacturing step of the semiconductor device in the first embodiment, following the step shown in FIG. 7.
Figure 10:
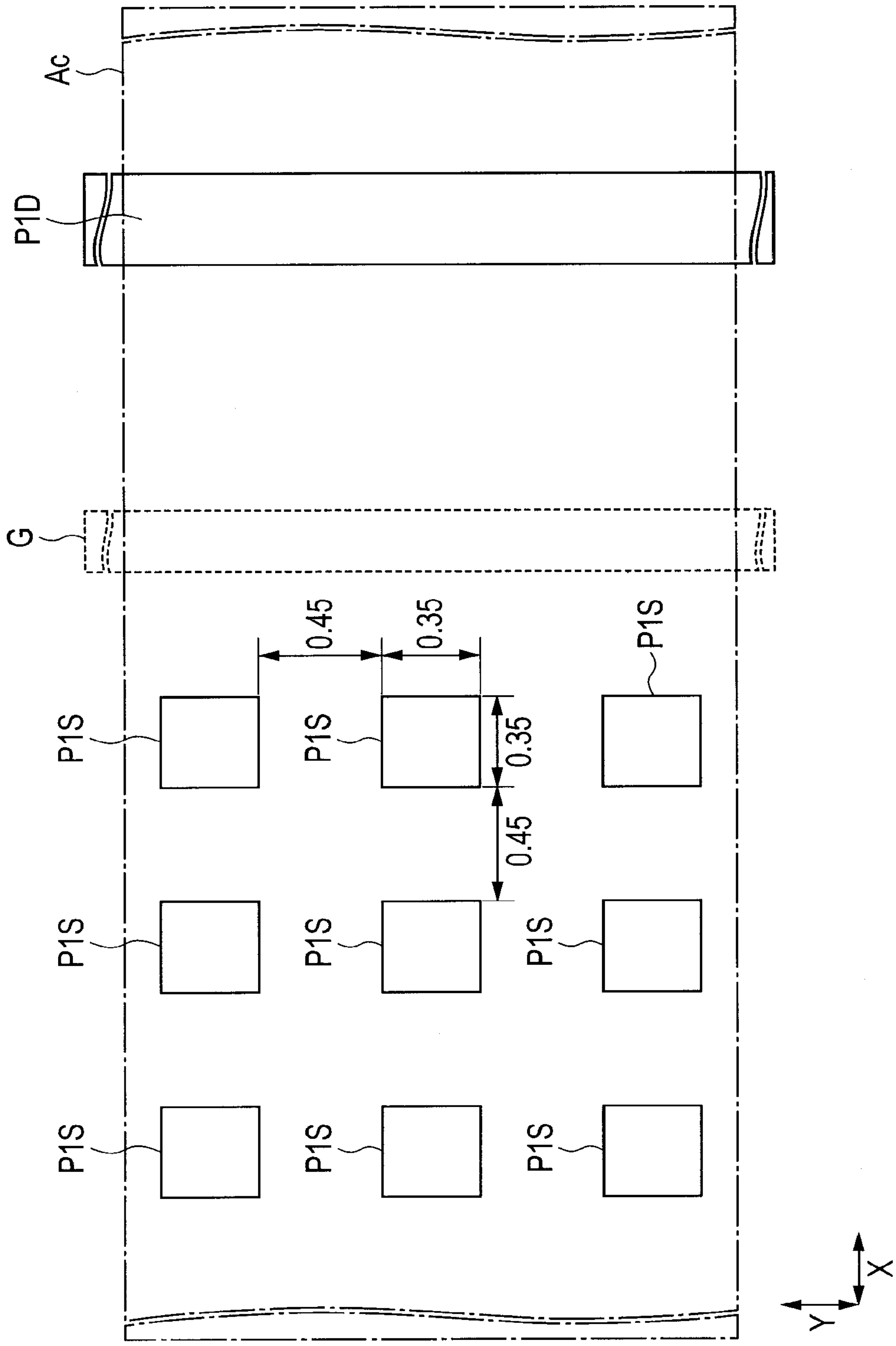
FIG. 10 is a plan view showing a main part of another manufacturing step of the semiconductor device in the first embodiment, specifically, a partial enlarged view of FIG. 9.

The gate plug P1G is disposed on the end of the gate electrode G extending in the direction Y as shown in FIG. 9, and not shown in the cross-sectional view of FIG. 8.

Figure 11:
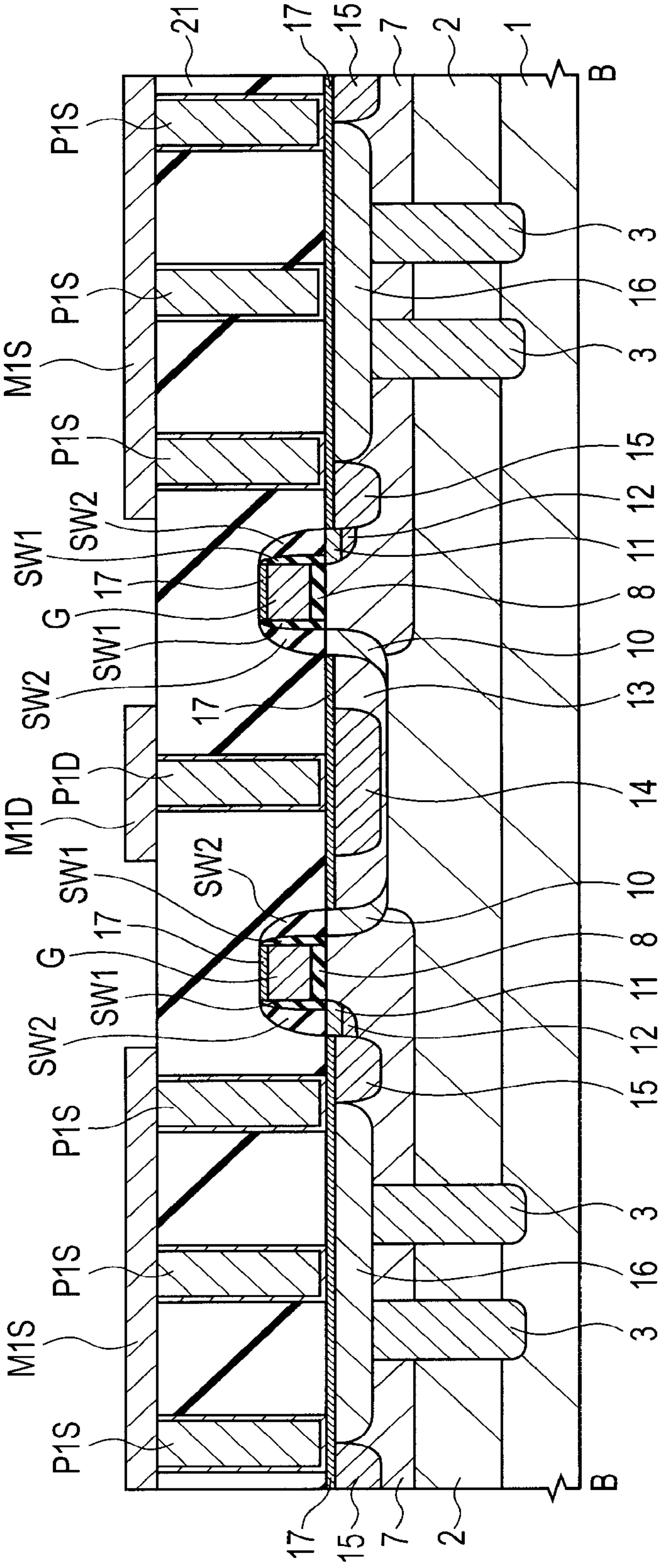
FIG. 11 is a cross-sectional view showing a main part of another manufacturing step of the semiconductor device in the first embodiment, following the step shown in FIG. 8.

Next, the following steps will be described below based on FIGS. 11 to 13. As shown in FIG. 11, a wiring (first layer wiring) M1 is formed over the insulating film 21 with the plugs (P1S, P1D, and P1G) embedded therein. The wiring M1 can be formed by forming a conductive film over the insulating film 21 with the plugs (P1S, P1D, and P1G) embedded therein, and patterning the conductive film by the photolithography and dry-etching. The wiring M1 can be a tungsten wiring including a tungsten (W) film as a principal component, or an aluminum wiring including an aluminum (Al) film as a principal component.

Until this step, the structure shown in FIG. 11 is obtained. FIG. 12 shows a plan view of a main part corresponding to the stage of the step shown in FIG. 11. FIG. 13 is a partial enlarged view of FIG. 12. As shown in FIGS. 12 and 13, the wiring M1 includes a source wiring (wiring for the source) M1S, a drain wiring (wiring for the drain) M1D, and a gate wiring (wiring for the gate) M1G. The source wiring (wiring for the source) M1S is electrically coupled to both the $n^+$-type source region 15 and the $p^+$-type semiconductor region 16 via the source plug P1S. The drain wiring M1D is electrically coupled to the $n^+$-type drain region 14 via the drain plug P1D. The gate wiring (wiring for the gate) M1G is electrically coupled to the gate electrode G via the gate plug P1G as shown in FIG. 12, and not shown in the cross-sectional view of FIG. 11.

Figure 12:
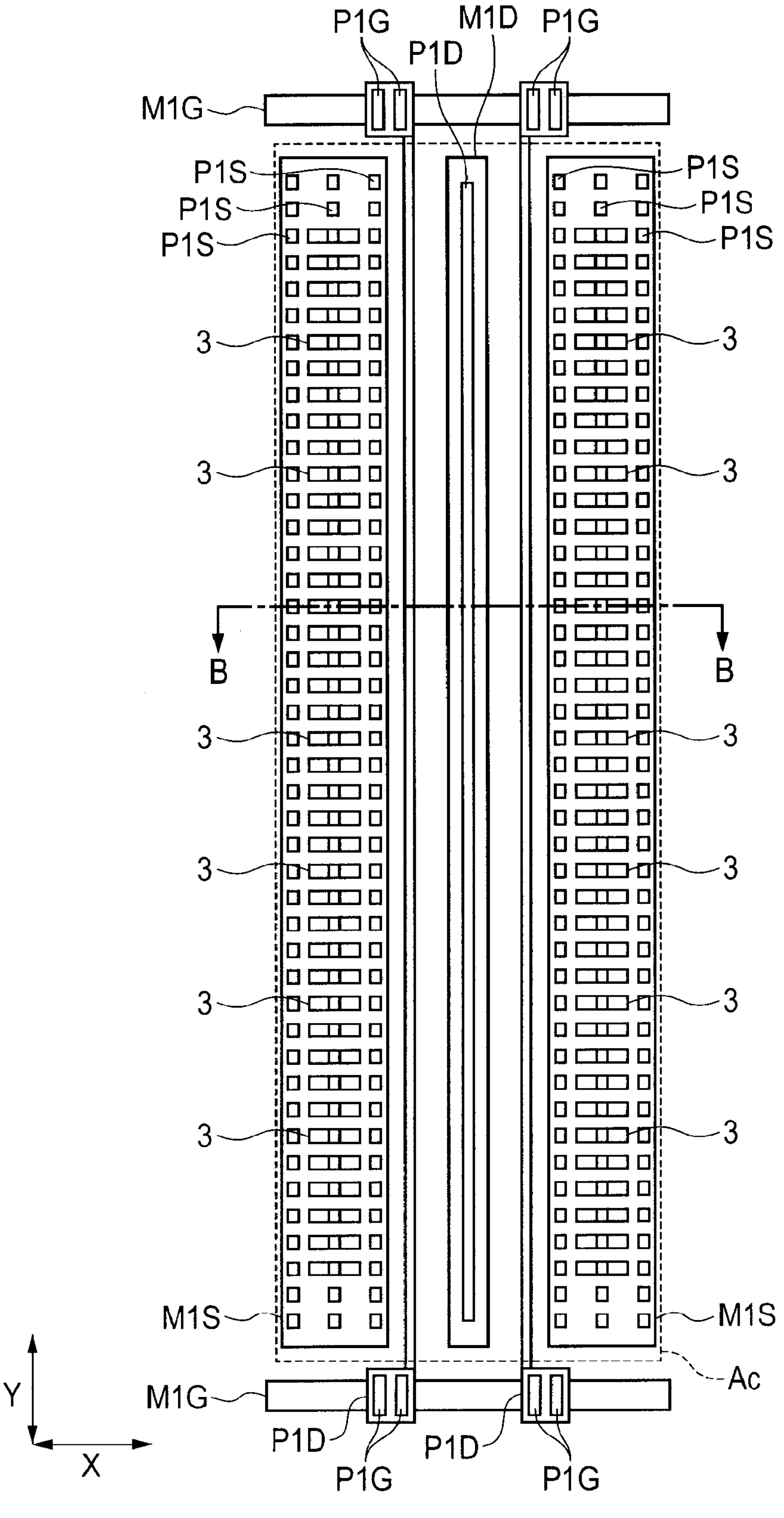
FIG. 12 is a cross-sectional view showing a main part of another manufacturing step of the semiconductor device in the first embodiment, following the step shown in FIG. 9.
Figure 13:
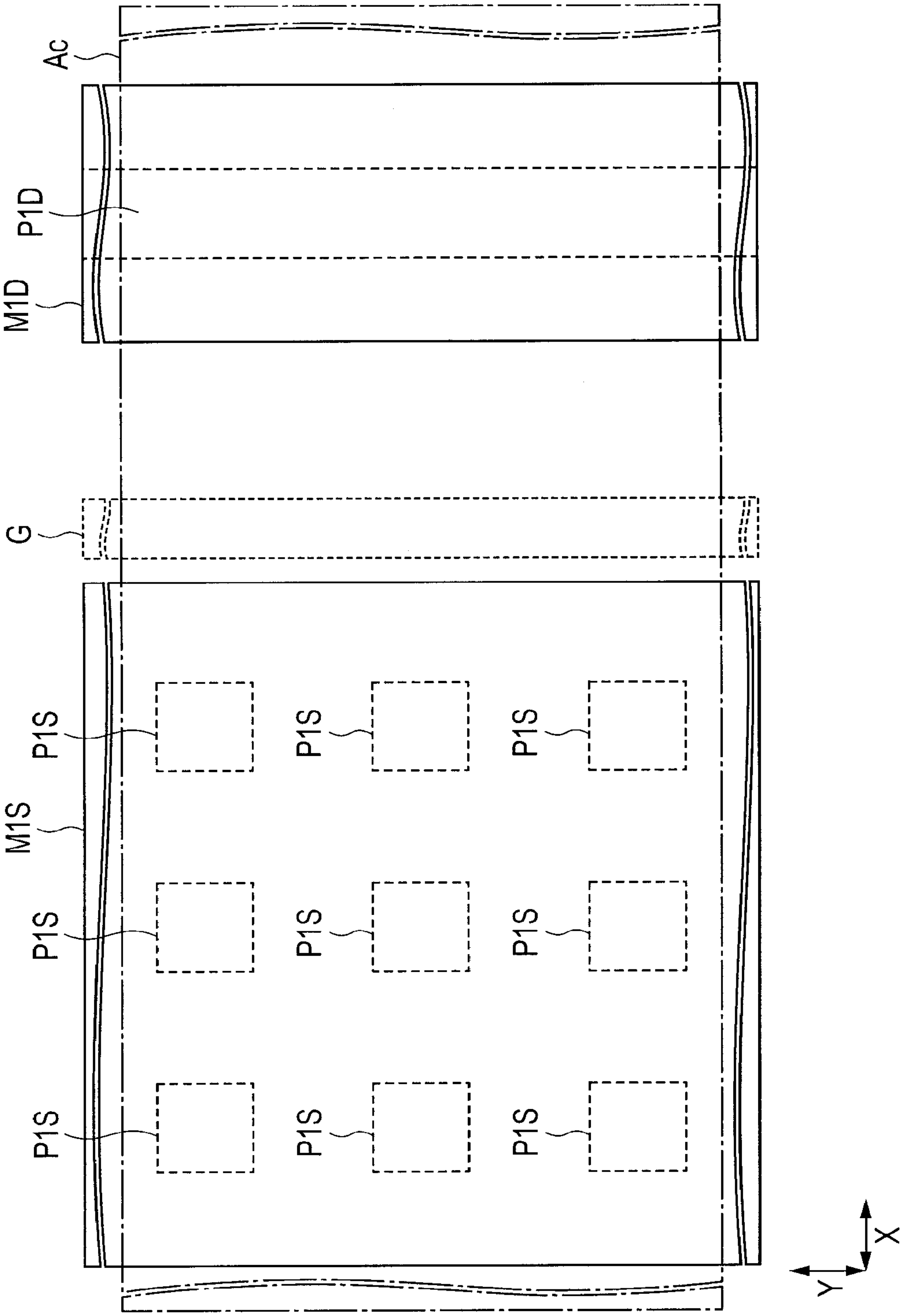
FIG. 13 is a plan view showing a main part of another manufacturing step of the semiconductor device in the first embodiment, specifically, a partial enlarged view of FIG. 12.

As shown in FIGS. 12 and 13, the drain wiring M1D extends in the direction Y in a gap between the adjacent gate electrodes G in the drain region (first $n^-$-type drain region 10, second $n^-$-type drain region 13, and $n^+$-type drain region 14). The source wiring M1S extends in the direction Y in another gap between the adjacent gate electrodes G in the source region ($n^-$-type source region 11 and $n^+$-type source region 15). The gate wiring M1G extends over the end of the gate electrode G in the direction X.

Figure 14:
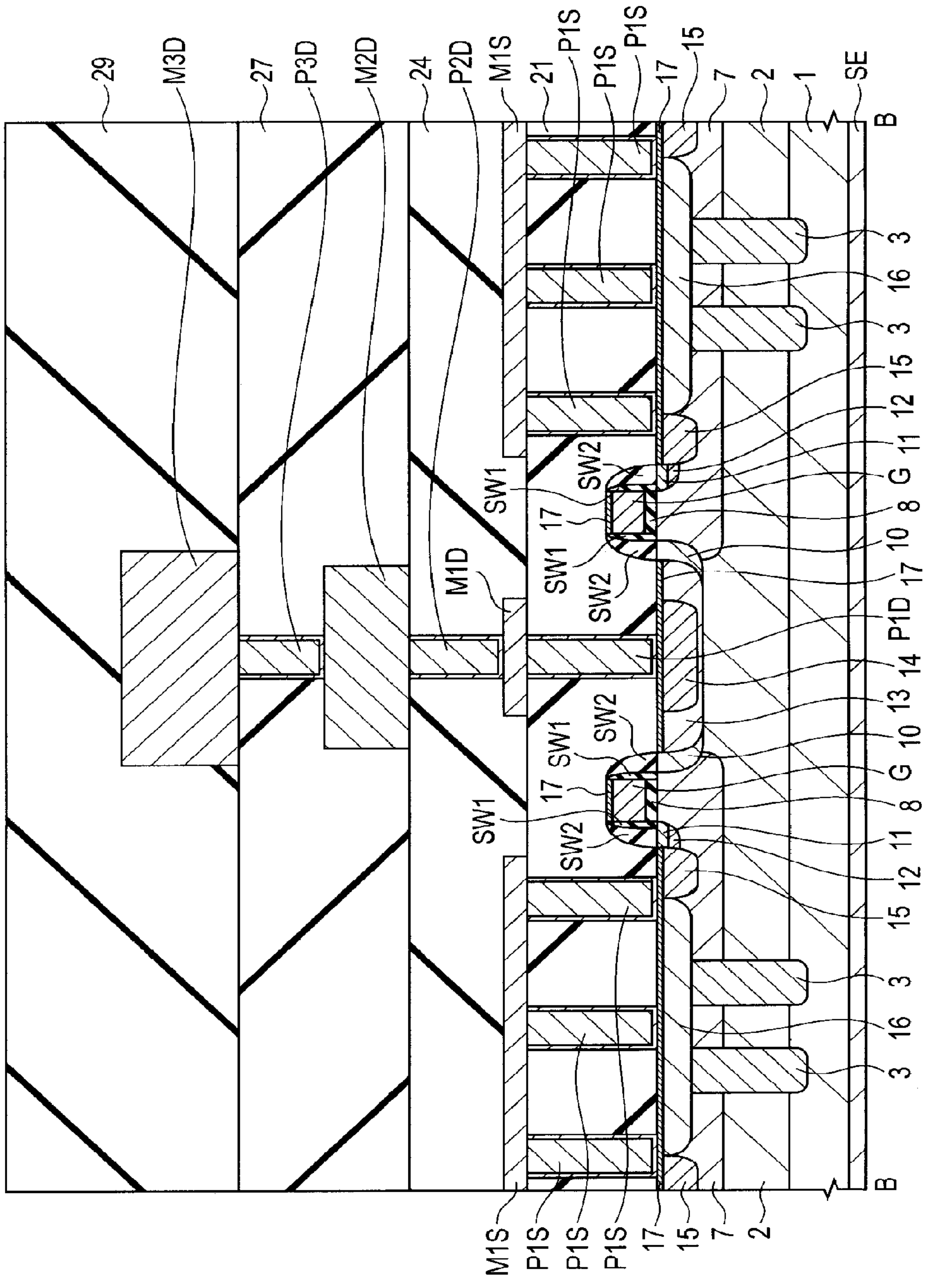
FIG. 14 is a cross-sectional view showing a main part of another manufacturing step of the semiconductor device in the first embodiment, following the step shown in FIG. 11.

Then, as shown in FIG. 14, an insulating film (interlayer insulating film) 24 comprised of a silicon oxide film is formed over the insulating film 21 by the CVD method or the like so as to cover the wiring M1.

Then, contact holes (through holes) are formed so as to expose a part of the drain wiring M1D to the insulating film 24 by dry-etching the insulating film 24 using a photoresist film (not shown) in a predetermined shape as an etching mask. A conductive film containing a tungsten (W) film as a principal component is embedded in each contact hole to thereby form a drain plug (conductor for coupling) P2D. The drain plug P2D can be formed substantially in the same way as the above plug P1. The drain plug P2D is positioned above at least drain wiring M1D. The drain plug P2D is formed in the same pattern shape and layout as those of the drain plug P1D. In this way, the drain plug P2D has its bottom brought into contact with and electrically coupled to the drain wiring M1D.

Then, a drain wiring (second layer wiring) M2D is formed over the insulating film 24 with the drain plugs P2D embedded therein. The drain wiring M2D can be formed by forming a conductive film including an aluminum (Al) alloy film as a principal component, over the insulating film 24 with the drain plugs P2D embedded therein, and patterning the conductive film using photolithography and dry-etching. The pattern shape of the drain wiring M2D is substantially the same as that of the drain wiring M1D (see FIG. 12). That is, the drain wiring M2D is formed in the substantially same pattern shape as that of the drain wiring M1D. The conductive film for forming the drain wiring M2D can use a laminated film formed by laminating a barrier conductive film (for example, a laminated film of a titanium film and a titanium nitride film), an aluminum film (or an aluminum alloy film), and a barrier conductive film (for example, a laminated film of a titanium film and a titanium nitride film) in that order from the bottom. In the laminated film, the barrier conductive film under and above the aluminum film as the main conductive film is thinner than the aluminum film.

Then, an insulating film (interlayer insulating film) 27, such as a silicon oxide film, is formed over the insulating film 24 by the CVD method or the like so as to cover the drain wiring M2D.

Then, contact holes (through holes) are formed so as to expose a part of the drain wiring M2D to the insulating film 24 by dry-etching the insulating film 27 using a photoresist film (not shown) in a predetermined shape as an etching mask. A conductive film containing a tungsten (W) film or an aluminum film as a principal component is embedded in each contact hole (through hole) to thereby form a drain plug (conductor for coupling) P3D. The drain plug P3D can be formed substantially in the same way as the above plug P1. The drain plug P2D is positioned above at least drain wiring M2D. The drain plug P3D is formed in the same pattern shape and layout as those of the drain plug P2D(P1D). In this way, the drain plug P3D has its bottom brought into contact with and electrically coupled to the drain wiring M2D.

Then, a drain wiring (third layer wiring) M3D is formed over an insulating film 27 with the drain plug P3D embedded therein. The drain wiring M3D can be formed by forming a conductive film containing an aluminum (Al) alloy film as a principal component, over the insulating film 27 with the drain plug P3D embedded, and patterning the conductive film by photolithography or dry etching, so that the drain wiring M3D comprised of the patterned conductive film can be formed. The conductive film for forming the drain wiring M3D can be formed using a lamination of a barrier conductive film (for example, a lamination of a titanium film and a titanium nitride film), an aluminum film (or aluminum alloy film), and a barrier conductive film (for example, a lamination of a titanium film and a titanium nitride film) which are laminated in that order from the bottom. Each of the barrier conductive films positioned above and below the aluminum film is thin as compared to the aluminum film as the main conductive film. Thus, the drain wiring M3D is formed of aluminum (Al) as a principal component.

Figure 15:
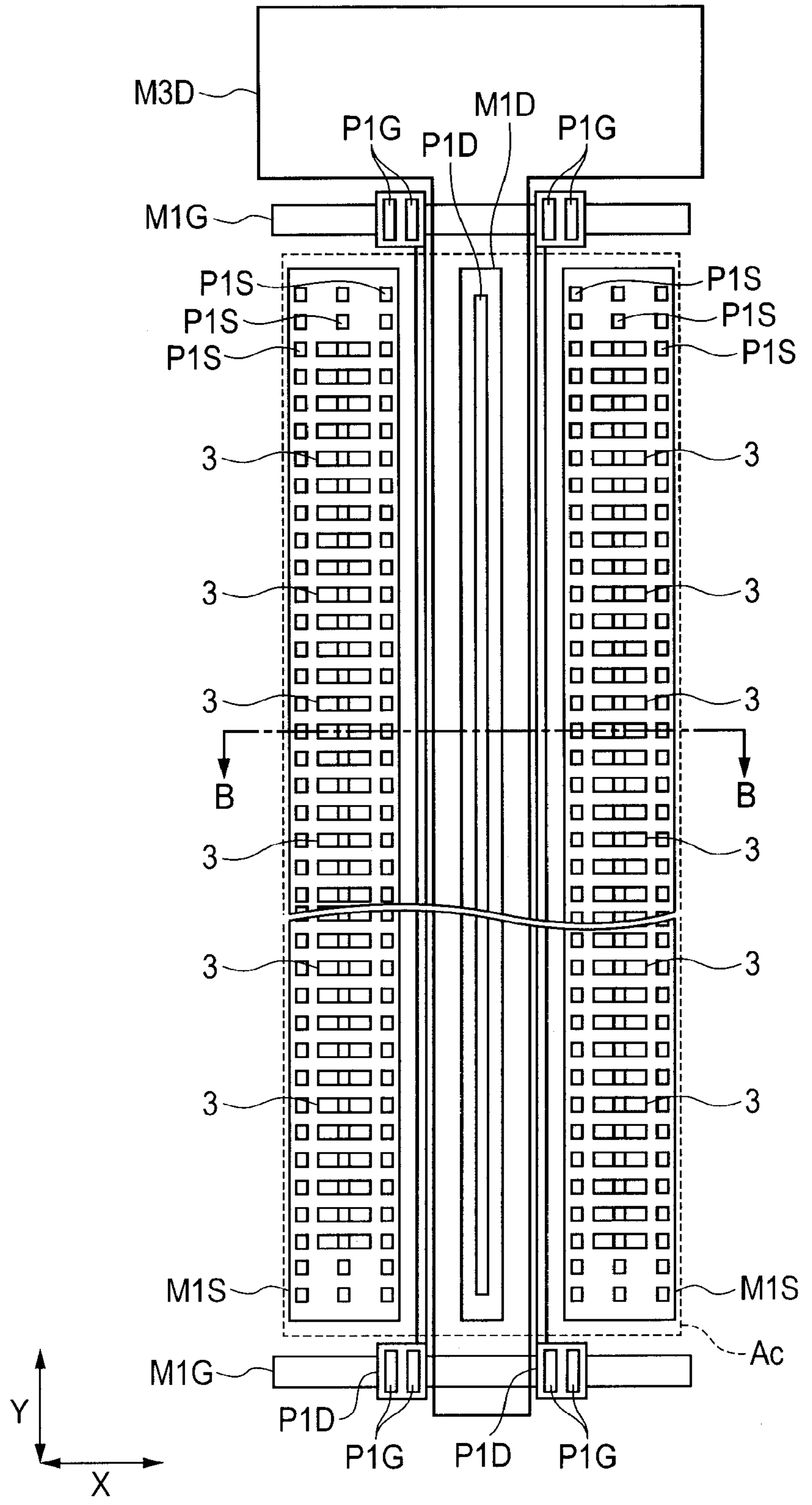
FIG. 15 is a cross-sectional view showing a main part of another manufacturing step of the semiconductor device in the first embodiment, following the step shown in FIG. 12.

The drain region extending in the direction Y and the drain plug P1D are coupled to each other in the direction X by the drain wiring M3D (see FIG. 15). That is, the drain wiring M3D has linear first parts extending in the direction Y like the drain wirings M1D and M2D, and a second part extending in the direction X. The first parts are coupled together by the second part in the direction X. The width of the first part in the direction X is larger than the width of each of the drain wirings M1D and M2D (see FIGS. 14 and 15). However, for convenience, in FIG. 3 which is a plan view described above, these widths are shown to be the same.

The structure (layout) of a unit cell (repeating unit, basic cell, a unit region, or a unit cell for the LDMOS) is repeated in the direction X as shown in FIG. 15. As shown in FIG. 16, the LDMOS has a repeating structure. That is, the source wiring M1S extending in the direction Y and the drain wiring M1D extending in the direction Y (M2D and drain wiring M3D) are alternately disposed in the direction X. The gate electrode G is positioned between the source wiring M1S extending in the direction Y and the drain wiring MD extending in the direction Y (see FIG. 15 or the like).

Subsequently, a laminated film of a silicon nitride film and a silicon oxide film is deposited as a protective film 29 over the drain wiring M3D by the CVD method or the like. Then, an opening (drain pad region (not shown)) is formed at the drain wiring M3D by etching a part of the protective film using a photoresist film having a predetermined shape as a mask. Another opening (gate pad region) is formed over a third layer wiring (not shown) electrically coupled to the gate wiring M1G.

Then, the backside of the substrate 1 is polished by a thickness of about 280 nm, and subsequently a source backside electrode (source electrode) SE is formed at the backside of the substrate 1. The source backside electrode SE can be formed by depositing a Ni(nickel)—Cu(copper) alloy film in a thickness of about 600 nm by sputtering.

Thereafter, the substrate 1 is cut along separation regions (not shown) into a plurality of chips. Then, for example, the backside of the chip on the source backside electrode SE side is coupled to a coupling portion of a wiring board via a solder or the like. The semiconductor device of the first embodiment is manufactured by coupling an external connection terminal of the wiring board to the above drain pad region or gate pad region via a wire (gold wire) or the like.

[Example of Application to Electronic Device]

Devices to which the semiconductor device (chip) of this embodiment is applied are not limited. However, the semiconductor device (chip) of this embodiment can be applied, for example, to a power amplification module (semiconductor device, electronic device, power amplifier, high power amplifier, high-frequency power amplifier, high-frequency power amplifying device, power amplifier module, or RF power module) used in a mobile communication device, such as a digital cellular phone (DPS).

Figure 17:
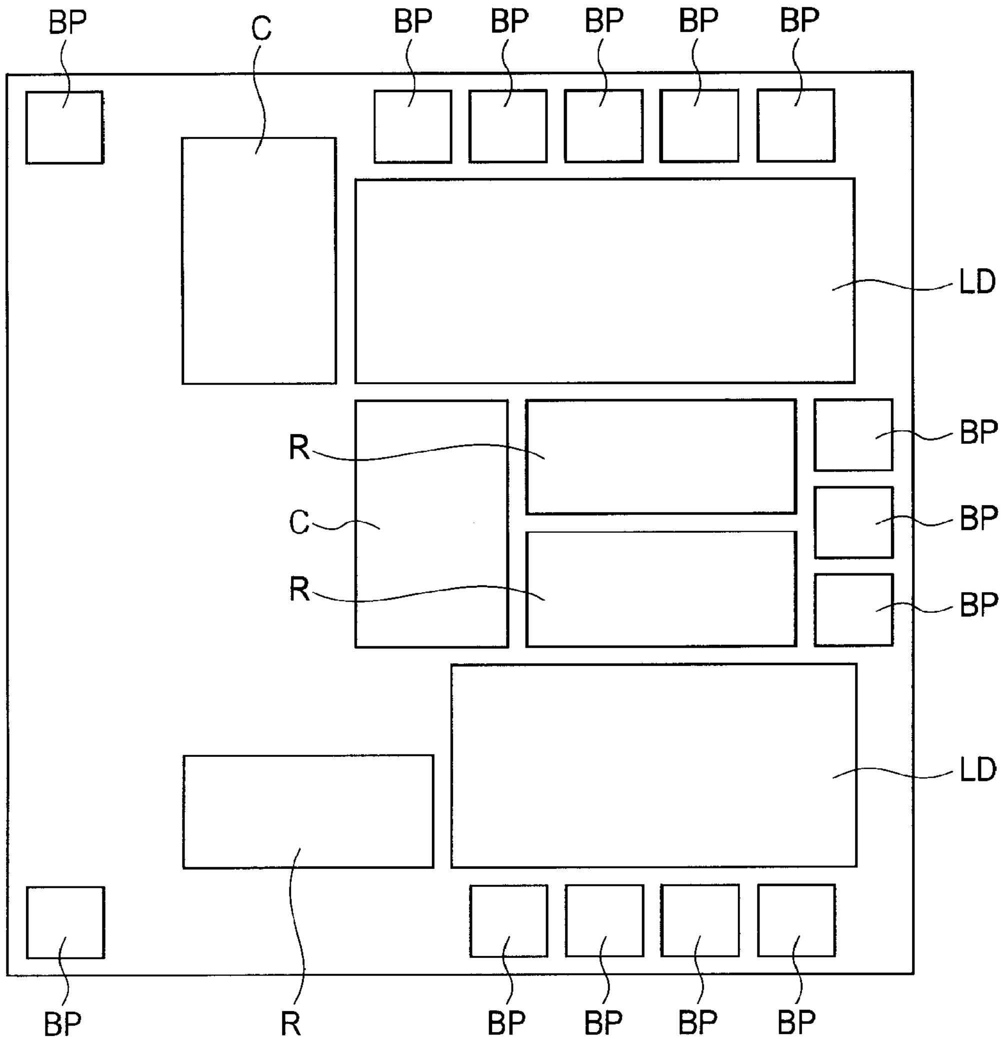
FIG. 17 is a plan view exemplarily showing an example of the structure of a power amplification module (chip)

FIG. 17 is a plan view exemplarily showing an example of the structure of the power amplifier module (chip). A chip includes LDMOS formation regions LD, a capacity formation region C, resistance formation regions R, and the like. The reference character BP indicates a pad region. These elements form the power amplification circuit. As shown in FIG. 17, two LDMOS formation regions LD are provided so as to respond to two frequency bands. In the relatively larger LDMOS formation region, each LDMOS is disposed.

Then, in the LDMOSs repeatedly disposed in the relatively large region (see FIG. 16), a parasitic capacitance tends to be generated. However, the use of the structure of this embodiment can largely reduce the parasitic capacitance.

The effects of this embodiment will be described below.

According to this embodiment, the number of wiring layers forming the source wiring is smaller than that of wiring layers forming the drain wiring, which can reduce the parasitic capacitance between the drain wiring and the source wiring.

The separation of the source plug P1S decreases the opposed area between the source plug P1S and the drain plug P1D, and can further reduce the parasitic capacitance therebetween. The separation of the source plug P1S can also reduce the parasitic capacitance between the source plug P1S and the drain wiring M1D.

That is, in the case of FIG. 27 as a comparative example in which the source plug P1S is extended in the direction Y without being separated, the opposed area between the source plug P1S and the drain plug P1D, and the opposed area between the source plug P1S and the drain wiring 141D become larger, which results in an increase in parasitic capacitance therebetween. In particular, the LDMOSs are repeatedly disposed in the relatively large region, which largely affects the parasitic capacitance.

In contrast, the semiconductor device of this embodiment can achieve the large reduction in parasitic capacitance by the above relatively simple structure. The manufacturing process of the semiconductor device in this embodiment can form the semiconductor device with good characteristics without increasing the number of masks (original plates) and the number of manufacturing steps, as compared to the above manufacturing process in the comparative example. The problem of the parasitic capacitance becomes remarkable with miniaturization of elements. However, the semiconductor device of this embodiment can easily miniaturize the elements to achieve the reduction in size, while keeping or improving the characteristics.

In this way, by decreasing the parasitic capacitance, this embodiment can prevents the reduction in power efficiency of an amplification element due to an increase in power, for example, in the above power amplification circuit and the like. In other words, the power efficiency given by the amplification element can be improved. Thus, the characteristics of the semiconductor device can be improved.

Second Embodiment

Although in the first embodiment, the drain plug P1D is linearly disposed to extend in the direction Y and only the source plug P1S is divided into the separated source plugs, a drain plug P1D may also be separated.

Figure 18:
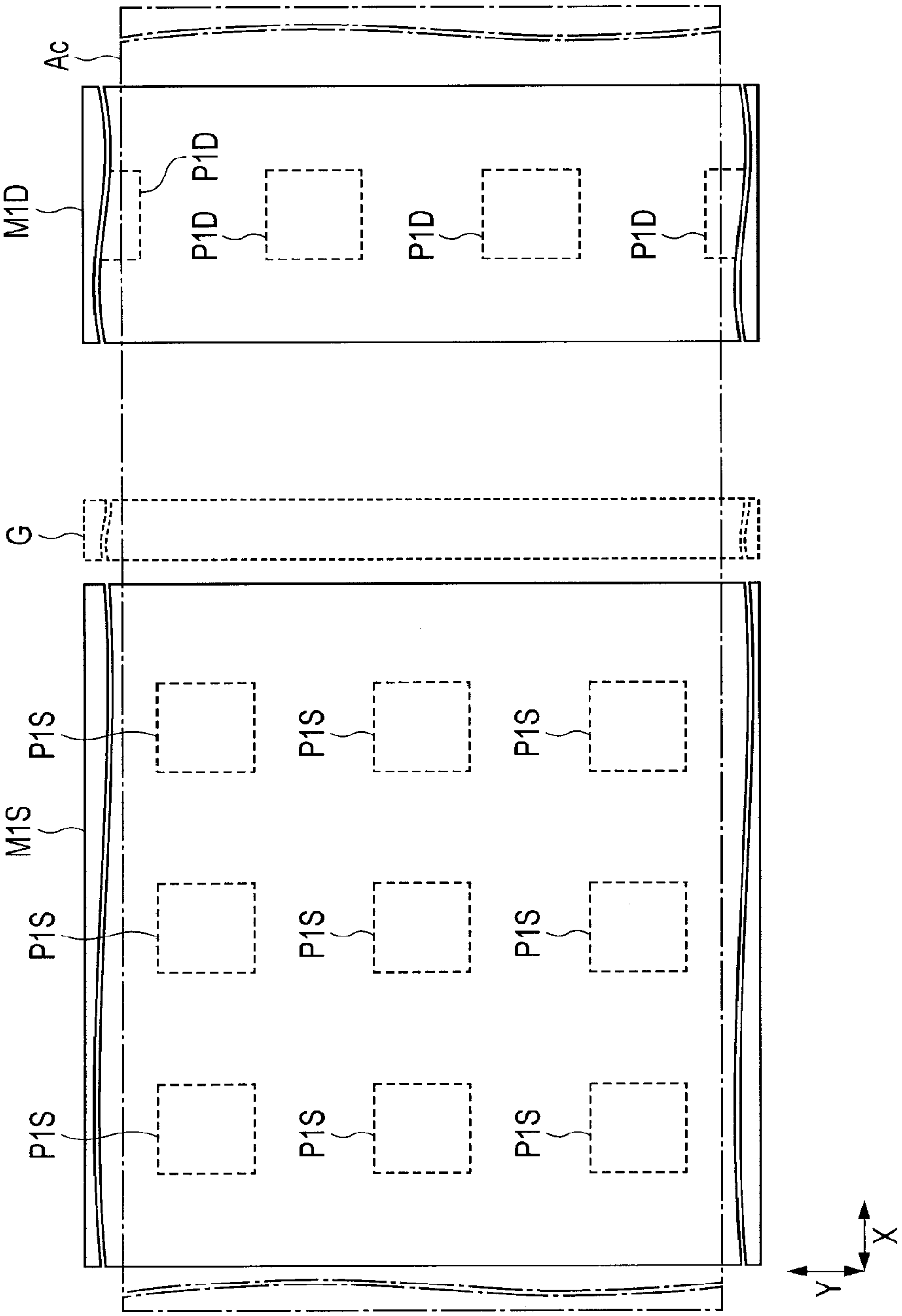
FIG. 18 is a plan view showing a main part of the structure of a semiconductor device according to a second embodiment.

FIG. 18 shows a plan view of the structure of the semiconductor device of this embodiment. The structure of this embodiment differs from the structure (see FIGS. 1 to 3) of the first embodiment only in the shape of the drain plug P1D. Now, only the structure of the drain plug P1D will be described below in detail, but the description of the structure of other parts will be omitted below.

Description of Structure

The semiconductor device of this embodiment has also the LDMOS with the same structure as that of the first embodiment. That is, the LDMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

The gate electrode G extends in the direction Y as shown in FIG. 18. The source region is disposed to extend in the direction Y in the region positioned on one side of the gate electrode G (on the left side of the gate electrode G in FIG. 18). The drain region is disposed to extend in the direction Y in the region positioned on the other side of the gate electrode G (on the right side of the gate electrode G in FIG. 18).

Although not shown in FIG. 18, a metal silicide layer 17 is formed over the drain region, the source region, and the gate electrode G forming the above LDMOS (see FIGS. 1 and 2, and the like). The source region is electrically coupled to the source plug P1S via the metal silicide layer 17. The drain region is electrically coupled to the drain plug P1D via the metal silicide layer 17. Although not shown in FIG. 18, the gate electrode G is electrically coupled to the gate plug P1G via the metal silicide layer 17 (see FIG. 9).

The drain plug P1D is formed in the region positioned on one side of the gate electrode G (on the right side of the gate electrode G as shown in FIG. 18). The source plug P1S is formed in the region positioned on the other side of the gate electrode G (on the left side of the gate electrode G as shown in FIG. 18).

As shown in FIG. 18, in this embodiment, the drain plug P1D is comprised of a plurality of separated drain plugs P1D. That is, the separated drain plugs P1D each having a square pole shape are disposed at predetermined intervals (first intervals) in the direction Y. In other words, the separated drain plugs P1D disposed in the direction Y have a rectangular pattern shape (shape in the planar view from the upper surface), and are disposed at the predetermined intervals in the direction Y.

The source plug P1S is comprised of a plurality of separated source plugs P1S, like the first embodiment. That is, the separated source plugs P1S each having a square pole shape are arranged in an array in the directions X and Y. In other words, the separated source plugs P1S disposed in the direction Y have a rectangular pattern shape (shape in the planar view from the upper surface), and disposed at predetermined intervals. The separated source plugs P1S disposed in the direction Y are hereinafter referred to as a separated source plug column. As shown in FIG. 18, three columns of separated source plugs are disposed in the region on the left side of the gate electrode G at predetermined intervals in the direction X. In the present specification, the term "source plug" and the term "separated source plug" are designated by the same reference character "P1S", and the term "drain plug" and the term "separated drain plug" are designated by the same reference character "P1D". Unless otherwise specified, the term "source plug" means all of the separated source plugs P1S, and the term "drain plug" means all of the separated drain plugs P1D.

In this embodiment, one separated drain plug P1D is shifted in the direction Y to be positioned between two adjacent separated source plugs P1S in the direction Y. In other words, each of the separated drain plugs P1D arranged in parallel in the direction Y, and each of the separated source plugs P1S arranged in parallel in the direction Y are alternatively arranged in the direction Y. In other words, the separated drain plugs P1D and the separated source plugs P1S are arranged in a houndstooth manner.

A drain wiring M1D is disposed over the drain plugs P1D. A source wiring M1S is disposed over the source plugs P1S.

Although not shown in FIG. 18, a gate wiring M1G is disposed over the gate plugs P1G (see FIG. 9). As shown in FIG. 18, the drain wiring M1D is linearly disposed to extend in the direction Y so as to cover the separated drain plugs P1D. The source wiring M1S is linearly disposed to extend in the direction Y so as to cover the separated source plugs P1S. The drain wiring M1D, the source wiring M1S, and the gate wiring M1G belong to a first layer wiring.

Like the first embodiment, although the drain plugs (P2D, P3D) and the drain wirings (M2D, MD3) are disposed over the drain wiring M1D, the illustration of the plugs and wirings is omitted.

In this way, in this embodiment, not only the source plug P1S, but also the drain plug P1D is separated, so that the opposed area between the source plug P1S and the drain plug P1D can be decreased.

Additionally, the separated drain plug P1D is shifted from the separated source plug P1S, whereby the opposed area therebetween can be further decreased.

The manufacturing method of the semiconductor device of this embodiment differs from the first embodiment only in the shape of the pattern in the formation step of the drain plugs P1D, and thus a description of the manufacturing method will be omitted below.

Figure 19:
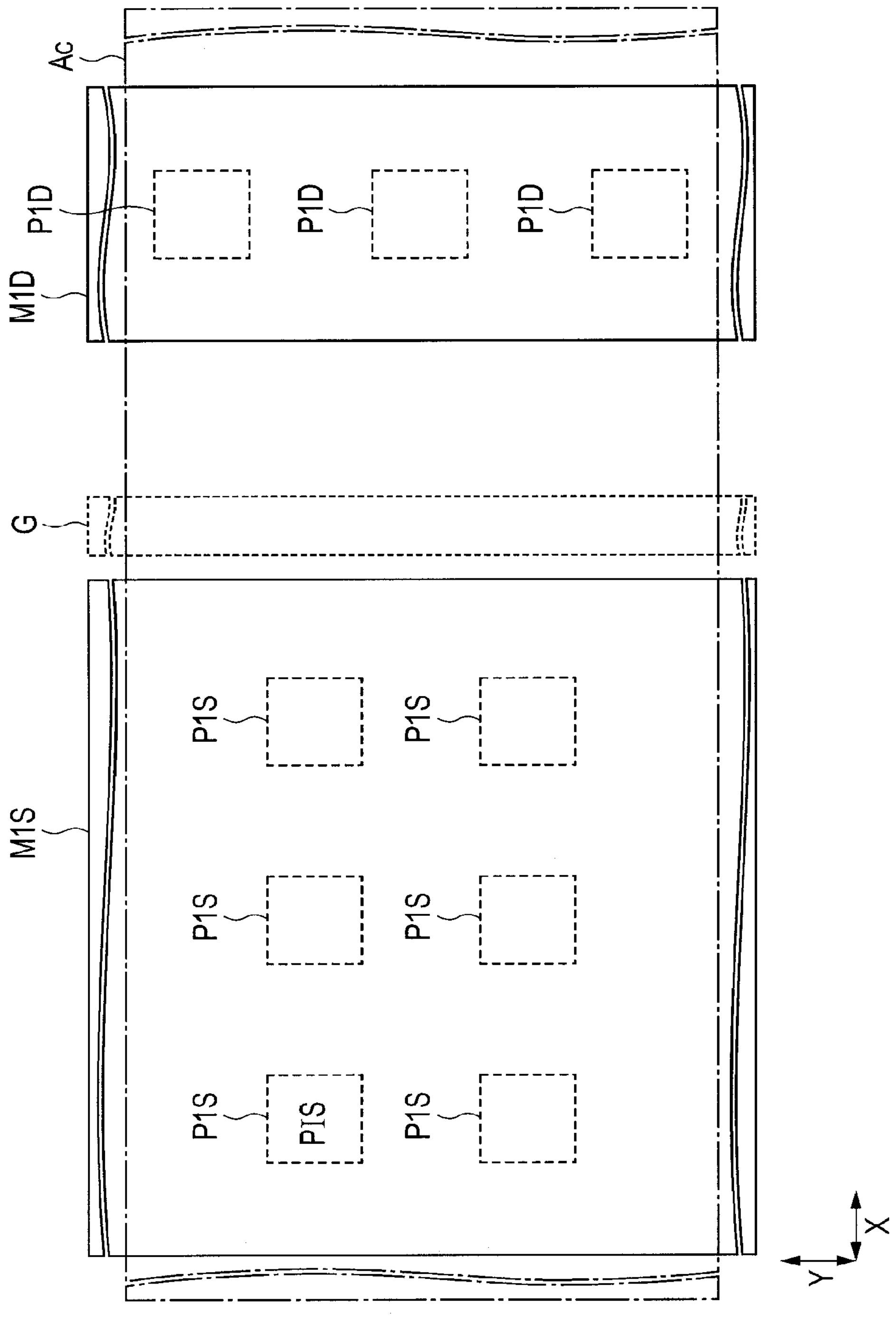
FIG. 19 is a plan view showing a main part of the structure of other regions in the second embodiment.

FIG. 19 shows a plan view of a main part of the structure of other regions in this embodiment. Referring to FIG. 19, the separated source plugs P1S are arranged in a 2×3 array in the region positioned on one side of the gate electrode G (on the left side of the gate electrode G in FIG. 19), and three separated drain plugs P1D are arranged in the direction Y in the region positioned on the other side of the gate electrode G (on the right side of the gate electrode G as shown in FIG. 19). FIG. 19 illustrates a region different from the region shown in FIG. 18. Like FIG. 18, one separated drain plug P1D is shifted in the direction Y to be positioned between two adjacent separated plugs P1S in the direction Y.

Third Embodiment

Although in the first embodiment, the drain plug P1D is linearly disposed in the direction Y and only the source plug P1S is divided into separated plugs, the drain plug P1D may be separated. Although in the first embodiment, the drain wiring M1D is linearly disposed to extend in the direction Y, the drain wiring M1D may also be separated.

Figure 20:
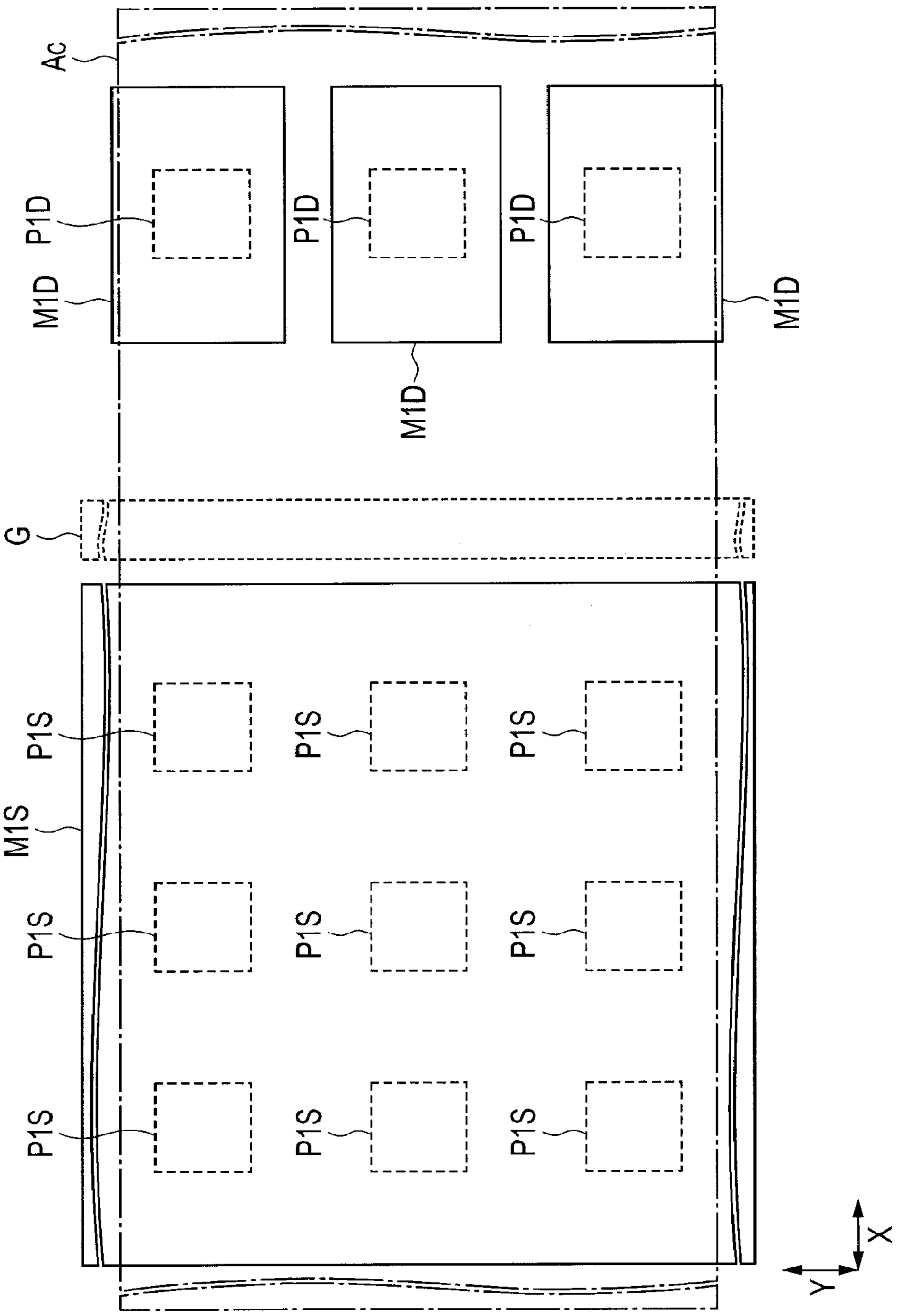
FIG. 20 is a plan view showing a main part of the structure of a semiconductor device according to a third embodiment.

FIG. 20 is a plan view showing the structure of the semiconductor device of this embodiment. The structure of this embodiment differs from that of the first embodiment (see FIGS. 1 to 3) only in the shape of the drain plug P1D and the shape of the drain wiring M1D. Now, only the structure of the drain plug P1D and the drain wiring M1D will be described in detail, and thus a description of the structure of other components will be omitted below.

Description of Structure

Also, the semiconductor device of this embodiment includes a LDMOS having the same structure as that of the first embodiment. That is, the LDMOS includes the drain region comprised of the first $n^-$-type drain region 10, the second $n^-$-type region 13, and the $n^+$-type drain region 14; the source region comprised of the $n^-$-type source region 11 and the $n^+$-source region 15; and the gate electrode G formed between the source and drain regions (in a channel formation region) via the gate insulating film 8 (see FIGS. 1 and 2 and the like).

The gate electrode G extends in the direction Y as shown in FIG. 20. The source region is disposed to extend in the direction Y in the region positioned on one side of the gate electrode G (on the left side of the gate electrode G as shown in FIG. 20). The drain region is disposed to extend in the direction Y in the region positioned on the other side of the gate electrode G (on the right side of the gate electrode G as shown in FIG. 20).

Although not shown in FIG. 20, the metal silicide layer 17 is formed over the drain region, the source region, and the gate electrode G forming the above LDMOS (see FIGS. 1 and 2, and the like). The source region is electrically coupled to the source plugs P1S via the metal silicide layer 17. The drain region is electrically coupled to the drain plug P1D via the metal silicide layer 17. Although not shown in FIG. 20, the gate electrode G is electrically coupled to the gate plug P1G via the metal silicide layer 17 (see FIG. 9).

The drain plugs P1D are formed in the region positioned on one side of the gate electrode G (on the right side of the gate electrode G in FIG. 20), and the source plugs P1S are formed in the region positioned on the other side of the gate electrode G (on the left side of the gate electrode G in FIG. 20).

As shown in FIG. 20, in this embodiment, the drain plug P1D is comprised of separated drain plugs P1D. That is, the separated drain plugs P1D each having a square pole shape are arranged at predetermined intervals in the direction Y. In other words, the separated drain plugs P1D disposed in the direction Y have a rectangular pattern shape (shape in the planar view from the upper surface), and are disposed at the predetermined intervals in the direction Y.

The source plug P1S is comprised of a plurality of separated source plugs P1S, like the first embodiment. That is, the separated source plugs P1S each having a square pole are arranged in an array in the directions X and Y. In other words, the separated source plugs P1S disposed in the direction Y have a rectangular pattern shape (shape in the planar view from the upper surface), and are disposed at the predetermined intervals. The separated source plugs P1S disposed in the direction Y are hereinafter referred to as a "separated source plug columns". As shown in FIG. 20, three columns of separated source plugs are disposed at predetermined intervals in the direction X in the region on the left side of the gate electrode G.

In this embodiment, the position of one separated drain plug P1D in the direction Y corresponds to the position of the separated source plug P1S in the direction Y. In other words, the separated drain plugs P1D and the separated source plugs P1S are arranged in parallel in the direction Y.

The drain wirings M1D are disposed over the drain plugs P1D. The source wiring M1S is disposed over the source plugs P1S. Although not shown in FIG. 20, the gate wiring M1G is disposed over the gate plugs P1G (see FIG. 9). As shown in FIG. 20, the drain wiring M1D is divided into separated drain wirings such that the separated drain wiring is disposed over each separated drain plug P1D among the separated drain plugs P1D. In other words, the drain wiring M1D has a plurality of separated drain wirings MUD disposed at predetermined intervals (second intervals) in the direction Y. In the present specification, the term "drain wiring" and the term "separated drain wiring" are designated by the same reference character "M1D". Unless otherwise specified, the term "drain wiring" means all of the separated drain wirings DUD.

Like the first embodiment, the drain wiring (M2D) is disposed over the drain wiring M1D via the drain plug P2D, and the drain wiring (M3D) is disposed thereover via the drain plug P3D. The illustration thereof will be omitted below. The above drain plug P2D is preferably disposed so as to be located over at least each separated drain wiring M1D. For example, the separated drain plugs P2D having the same pattern shape and layout as those of the separated drain plugs P1D shown in FIG. 20 are formed. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this way, in this embodiment, not only the source plug P1S, but also the drain plug P1D is separated, which can reduce the opposed area between the source plug P1S and the drain plug P1D.

Additionally, by separating the drain wiring IUD, the opposed area between the source plug P1S and the drain wiring M1D can be decreased.

The manufacturing method of the semiconductor device of this embodiment differs from the first embodiment in the shape of each pattern in the formation steps of the drain plugs P1D and the drain wirings M1D, and thus a description of the manufacturing method of this embodiment will be omitted below.

Although in this embodiment, the drain wiring 141D is separated such that the separated drain plug P1D corresponds to the separated wiring M1D one by one, for example, the drain wiring M1D may be separated to step over the separated drain plugs P1D adjacent thereto in the direction Y. Thus, the drain wiring M1D may be separated every separated drain plug P1D.

Fourth Embodiment

Although in the first embodiment, the source wiring M1S is linearly formed to extend in the direction Y, that is, the pattern shape of the source wiring M1S has a rectangular shape having its long side in the direction Y, the source wiring M1S may be provided with a cutout portion. Like the above third embodiment, <1> the drain plug P1D may be separated, and <2> the drain wiring M1D may be separated.

Figure 21:
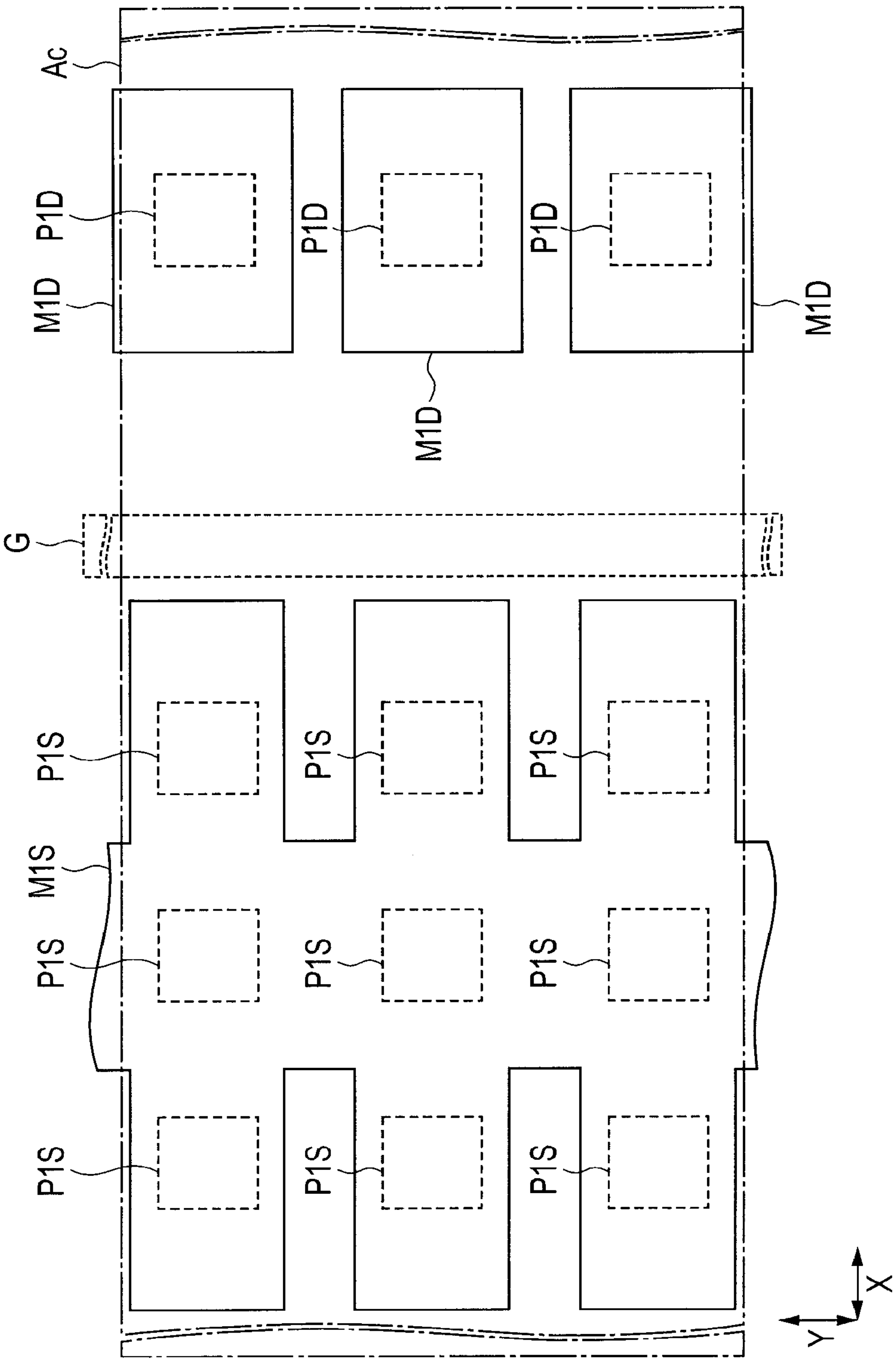
FIG. 21 is a plan view showing a main part of the structure of a semiconductor device according to a fourth embodiment.

FIG. 21 is a plan view showing the structure of the semiconductor device in this embodiment. The structure of this embodiment differs from the structure of the first embodiment (FIGS. 1 to 3) only in the shapes of the drain plug P1D, the drain wiring M1D, and the source wiring M1S. Thus, only these components will be described in detail below, and the description of the structures of other parts will be omitted below.

Description of Structure

The semiconductor device of this embodiment also includes a LDMOS having the same structure as that of the first embodiment. That is, the LDMOS includes the drain region comprised of the first $n^-$-type drain region 10, the second $n^-$-type drain region 13, and the type drain region 14; the source region comprised of the $n^-$-type source region 11 and an $n^+$-source region 15; and the gate electrode G formed between the source and drain regions (in a channel formation region) via the gate insulating film 8 (see FIGS. 1 and 2 and the like).

The gate electrode G extends in the direction Y as shown in FIG. 21. The gate electrode G is disposed such that the source region extends in the direction Y in the region positioned on one side of the gate electrode G (on the left side of the gate electrode G in FIG. 21). Further, the gate electrode G is disposed such that the drain region extends in the direction Y in the region positioned on the other side of the gate electrode G (on the right side of the gate electrode G in FIG. 21).

Although not shown in FIG. 21, the metal silicide layer 17 is formed over the drain region, source region, and gate electrode G forming the above LDMOS (see FIGS. 1 and 2, and the like). The source region is electrically coupled to source plugs P1S via the metal silicide layer 17. The drain region is electrically coupled to the drain plug P1D via the metal silicide layer 17. Although not shown in FIG. 21, the gate electrode G is electrically coupled to the gate plug P1G via the metal silicide layer 17 (see FIG. 9).

The drain plugs P1D are formed in the region positioned on one side of the gate electrode G (on the right side of the gate electrode G as shown in FIG. 21), and the source plugs P1S are formed in the region positioned on the other side of the gate electrode G (on the left side of the gate electrode G as shown in FIG. 21).

As shown in FIG. 21, in this embodiment, the drain plug P1D is comprised of a plurality of separated drain plugs P1D. That is, the separated drain plugs P1D each having a square pole are disposed at first intervals in the direction Y. In other words, the separated drain plugs P1D disposed in the direction Y have a rectangular pattern shape (shape in the planar view from the upper surface), and are disposed at the predetermined intervals in the direction Y.

Like the first embodiment, the source plug P1S is comprised of separated source plugs P1S. That is, the separated drain plugs P1S each having a square pole shape are arranged in the array in the directions X and Y. In other words, the separated source plugs P1S disposed in the direction Y have a rectangular pattern shape (shape in the planar view from the upper surface), and are disposed at the predetermined intervals. The separated source plugs P1S disposed in the direction Y are hereinafter referred to as "separated source plug column". As shown in FIG. 3, three columns of the separated source plugs are disposed at predetermined intervals in the direction X in the region on the left side of the gate electrode G.

In this embodiment, the position of one separated drain plug P1D in the direction Y corresponds to the position of the separated source plug P1S in the direction Y. In other words, the separated drain plug P1D and the separated source plug P1S are disposed in parallel in the direction Y.

The drain wiring M1D is disposed over each drain plug P1D. The source wiring M1S is disposed over the source plugs P1S. Although not shown in FIG. 21, the gate wiring M1G is disposed over the gate plug P1G (see FIG. 9). As shown in FIG. 21, the drain wiring M1D is divided into separated drain wirings such that each separated drain wiring is disposed over one corresponding separated drain plug P1D among the separated drain plugs P1D. In other words, the drain wiring M1D has a plurality of separated drain wirings M1D disposed at predetermined intervals (second intervals) in the direction Y.

Cutout portions are provided in the source wiring M1S. That is, as shown in FIG. 21, the source wiring M1S extends in the direction Y as a whole, and parts of the end of the wiring M1S positioned on the drain plug P1D side among the ends extending in the direction Y recede in the direction X. The receding part is hereinafter referred to as the cutout portion. The cutout portion is provided to be located between the adjacent separated source plugs P1S in the direction Y. As mentioned above, the separated drain plugs P1D and the separated source plugs P1S are arranged in parallel in the direction Y. The cutout portion is provided in the corresponding position between the adjacent separated drain plugs P1D in the direction Y.

Like the first embodiment, the drain wiring (M2D) is disposed over the drain wiring M1D via the drain plug P2D, and further the drain wiring (M3D) is disposed thereover via the drain plug P3D, but the illustration thereof will be omitted below. The drain plug P2D is preferably positioned above at least each separated drain wiring M1D. For example, the drain plug P2D is formed in the same pattern shape and layout as those of the separated drain plug P1D shown in FIG. 21. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this way, in this embodiment, not only the source plug P1S, but also the drain plug P1D is separated, so that the opposed area between the source plug P1S and the drain plug P1D can be decreased. Additionally, the separation of the drain wiring M1D can decrease the opposed area between the source plug P1S and the drain wiring M1D.

Additionally, since the cutout portions are provided in the source wiring M1S, the distance between the source wiring 141S and the separated drain plug P1D at the cutout portion becomes large, which can reduce the parasitic capacitance. Further, at the cutout portion, the distance between the source wiring M1S and the separated drain wiring M1D also becomes large, which can reduce the parasitic capacitance.

The manufacturing method of the semiconductor device of this embodiment differs from the first embodiment only in the shape of the pattern and layout in the formation steps of the drain plug P1D, the drain wiring M1D, and the source wiring M1S, and thus a description thereof will be omitted below.

Although in this embodiment, the drain wiring M1D is separated such that the separated drain plug P1D corresponds to the separated wiring IUD one by one, for example, the drain wiring M1D may be separated to step over the separated drain plugs P1D adjacent thereto in the direction Y. As mentioned above, the drain wiring M1D may be separated for each separated drain plug P1D.

Fifth Embodiment

In the first embodiment, the drain plug P1D is linearly disposed to extend in the direction Y, and only the source plug P1S is separated. However, in this embodiment, <1> the drain plug P1D may be divided into the separated drain plugs, which may be shifted from the separated source plugs P1S in the direction Y, like the second embodiment, and <2> the drain wiring IUD may be separated and <3> the source wiring M1S may be provided with the cutout portions, like the fourth embodiment.

Figure 22:
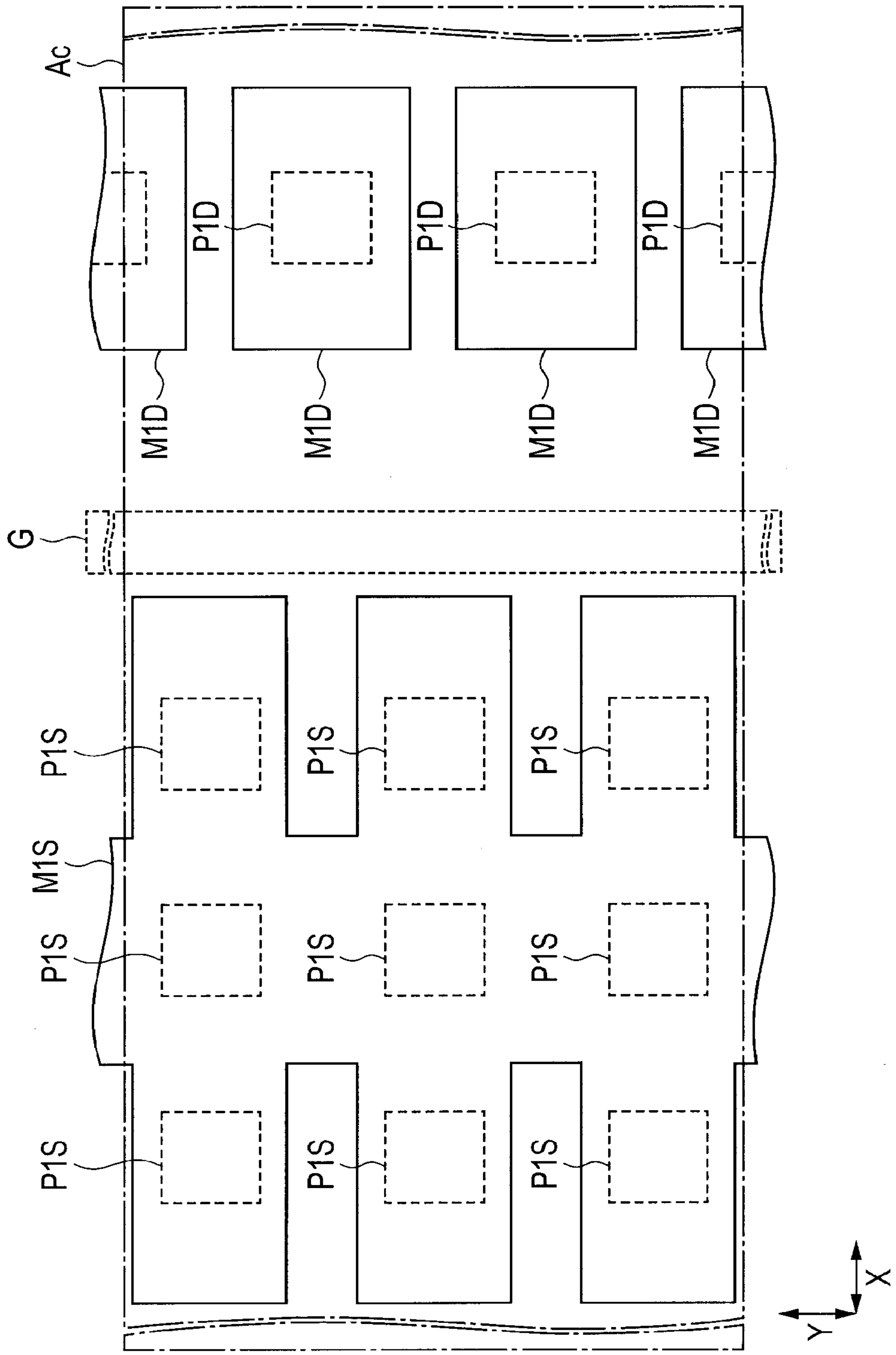
FIG. 22 is a plan view showing a main part of the structure of a semiconductor device according to a fifth embodiment.

FIG. 22 is a plan view showing the structure of the semiconductor device of this embodiment. This embodiment differs from the structure of the first embodiment (see FIGS. 1 to 3) only in the shapes of the drain plug P1D, the drain wiring M1D, and the source wiring M1S. Now, the structure of these elements will be described below in detail, and the description of the structure of other parts will be omitted below.

Description of Structure

The semiconductor device of this embodiment also includes a LDMOS having the same structure as that of the first embodiment. That is, the DLMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

The gate electrode G extends in the direction Y as shown in FIG. 22. The gate electrode G is disposed such that the source region extends in the direction Y in the region positioned on one side of the gate electrode G (on the left side of the gate electrode G in FIG. 22). Further, the gate electrode G is disposed such that the drain region extends in the direction Y in the region positioned on the other side of the gate electrode G (on the right side of the gate electrode G in FIG. 22).

Although not shown in FIG. 22, the metal silicide layer 17 is formed over the drain region, the source region, and the gate electrode G forming the above LDMOS (see FIGS. 1 and 2, and the like). The source region is electrically coupled to the source plug P1S via the metal silicide layer 17. The drain region is electrically coupled to the drain plug P1D via the metal silicide layer 17. Although not shown in FIG. 22, the gate electrode G is electrically coupled to the gate plug P1G via the metal silicide layer 17 (see FIG. 9).

The drain plug P1D is formed in the region positioned on one side of the gate electrode G (on the right side of the gate electrode G in FIG. 22). The source plug P1S is formed in the region positioned on the other side of the gate electrode G (on the left side of the gate electrode G in FIG. 22).

As shown in FIG. 22, in this embodiment, the drain plug P1D is comprised of a plurality of separated plugs P1D. That is, the separated drain plugs P1D each having a square pole shape are disposed at first intervals in the direction Y. In other words, the form of the pattern shape (shape in the planar view from an upper surface) of the separated drain plugs P1D disposed in the direction Y is rectangular. The separated drain plugs P1D are disposed at predetermined intervals in the direction Y.

Like the first embodiment, the source plug P1S is comprised of separated source plugs P1S. That is, the separated source plugs P1S each having a the square pole shape are arranged in the array in the directions X and Y. In other words, the pattern shape (shape in the planar view from an upper surface) of the separated source plugs P1S disposed in the direction Y is rectangular. The separated source plugs P1S are disposed at predetermined intervals. The separated source plugs P1S disposed in the direction Y is hereinafter referred to as a "separated source plug column". As shown in FIG. 22, three columns of separated source plugs are disposed in the direction X at predetermined intervals in the region on the left side of the gate electrode G.

In this embodiment, one separated drain plug P1D is shifted in the direction Y to be positioned between two adjacent separated plugs P1S in the direction Y. In other words, each of the separated drain plugs P1D arranged in parallel in the direction Y, and each of the separated source plugs P1S arranged in parallel in the direction Y are alternatively arranged in the direction Y. In other words, the separated drain plugs P1D and the separated source plugs P1S are arranged in a houndstooth manner.

The drain wiring M1D is disposed over the drain plug P1D. The source wiring M1S is disposed over the source plugs P1S. Although not shown in FIG. 22, the gate wiring M1G is disposed over the gate plug P1G (see FIG. 9). As shown in FIG. 22, the drain wiring 141D is divided into separated drain wirings such that each separated drain wiring is disposed over the corresponding separated drain plug P1D among the separated drain plugs P1D. In other words, the drain wiring M1D has a plurality of separated drain wirings M1D disposed at predetermined intervals (second intervals) in the direction Y.

Cutout portions are provided in the source wiring M1S. That is, as shown in FIG. 22, the source wiring M1S extends in the direction Y as a whole, and parts of the end of the wiring M1S positioned on the drain plug P1D side among the ends extending in the direction Y recede in the direction X. The receding part is hereinafter referred to as a "cutout portion". The cutout portion is provided to be located between the adjacent separated source plugs P1S in the direction Y. As mentioned above, the separated drain plugs P1D are shifted from the separated source plugs P1S in the direction Y. The cutout portion is provided in the position corresponding to the separated drain plug P1D in the direction Y.

Like the first embodiment, the drain wiring (M2D) is disposed over the drain wiring M1D via the drain plug P2D, and the drain wiring (M3D) is disposed thereover via the drain plug P3D. The illustration thereof will be omitted below. The above drain plug P2D is preferably disposed so as to be located over at least each separated drain wiring M1D. For example, the drain plug P2D is formed in the same pattern shape and layout as those of the drain plug P1D shown in FIG. 22. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this embodiment, not only the source plug P1S, but also the drain plug P1D is separated, so that the opposed area between the source plug P1S and the drain plug P1D can be decreased. The separation of the drain wiring M1D can decrease the opposed area between the source plug P1S and the drain wiring M1D.

Additionally, since the cutout portions are provided in the positions corresponding to the separated drain plugs P1D at the source wiring M1S in the direction Y, the distance between the source wiring M1S and the separated drain plug P1D at each cutout portion becomes large, which can reduce the parasitic capacitance. Further, at the cutout portion, the distance between the source wiring M1S and the separated drain wiring M1D also becomes large, which can reduce the parasitic capacitance.

The manufacturing method of the semiconductor device of this embodiment differs from the first embodiment only in the shape of the pattern and layout in the formation steps of the drain plug P1D, the drain wiring M1D, and the source wiring M1S, and thus a description thereof will be omitted below.

Although in this embodiment, the drain wiring M1D is separated such that the separated drain plug P1D corresponds to the separated wiring M1D one by one, for example, the drain wiring M1D may be separated to step over the separated drain plugs P1D adjacent thereto in the direction Yl. As mentioned above, the drain wiring M1D may be separated for each separated drain plug P1D.

Sixth Embodiment

Although in the first embodiment three columns of separate source plugs are provided, the separated source plugs arranged in parallel in the direction X (three separated source plugs in the direction X as shown in FIG. 3) are coupled together into a square pole having a long side in the direction X. Like the fifth embodiment, <1> the drain plug P1D may be divided into the separated drain plugs, which may be shifted from the separated source plugs P1S in the direction Y, and <2> the drain wiring M1D may be separated and <3> the source wiring M1S may be provided with the cutout portions.

Figure 23:
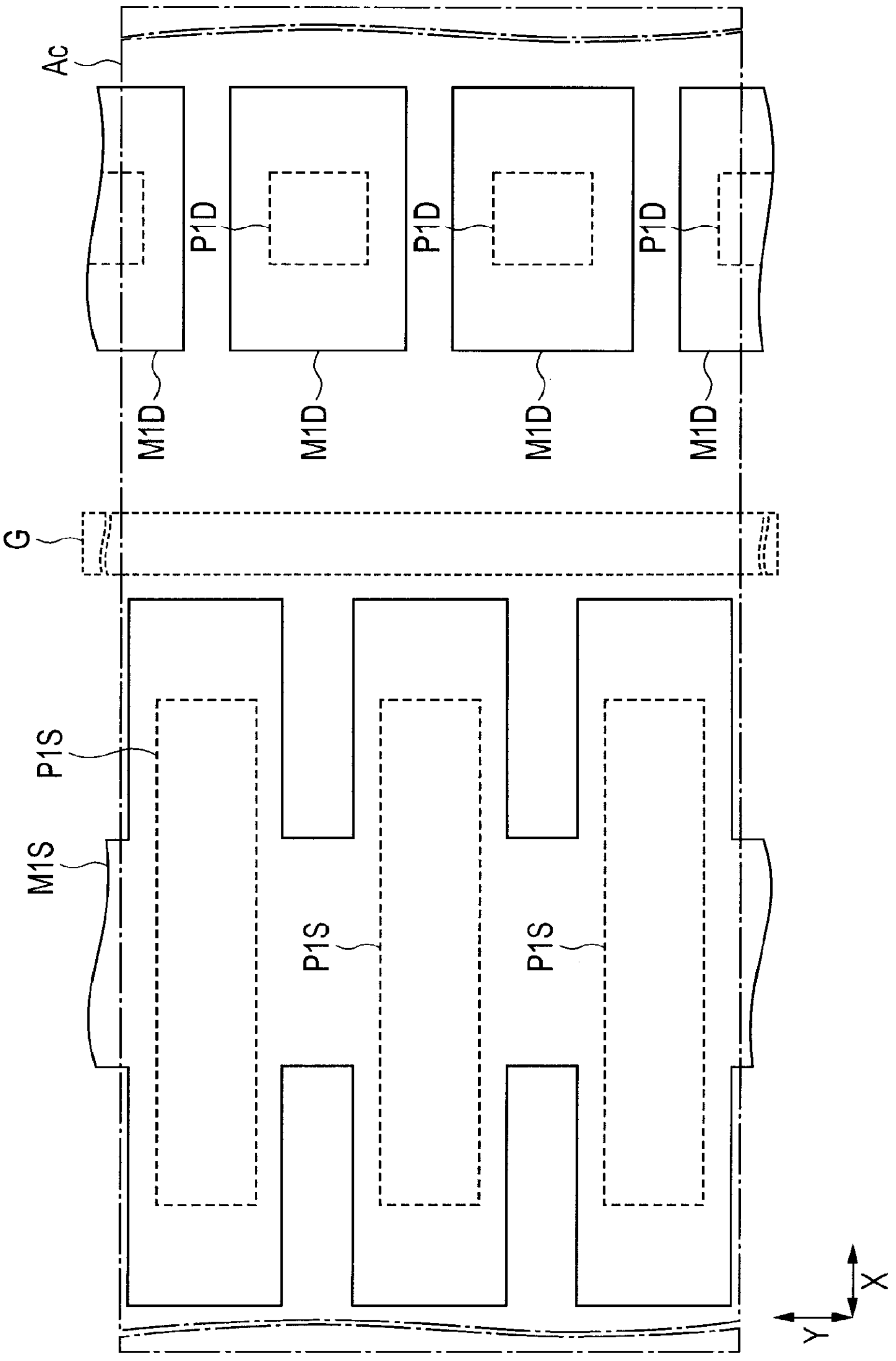
FIG. 23 is a plan view showing a main part of the structure of a semiconductor device according to a sixth embodiment.

FIG. 23 shows a plan view of the structure of the semiconductor device in this embodiment. The structure of this embodiment differs from that of the first embodiment (see FIGS. 1 to 3) in the shapes of the source plug P1S, the drain plug P1D, the drain wiring M1D, and the source wiring M1S. Now, the structure of these elements will be described below in detail, and the description of the structure of other parts will be omitted below.

Description of Structure

The semiconductor device of this embodiment has also the LDMOS with the same structure as that of the first embodiment. That is, the DLMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

The gate electrode G extends in the direction Y as shown in FIG. 23. A source region is disposed to extend in the direction Y in the region positioned on one side of the gate electrode G (on the left side of the gate electrode G in FIG. 23). A drain region is disposed to extend in the direction Y in the region positioned on the other side of the gate electrode G (on the right side of the gate electrode G in FIG. 23).

Although not shown in FIG. 23, the metal silicide layer 17 is formed over the drain region, the source region, and the gate electrode G forming the above LDMOS (see FIGS. 1 and 2, and the like). The source region is electrically coupled to the source plug P1S via the metal silicide layer 17. The drain region is electrically coupled to the drain plug P1D via the metal silicide layer 17. Although not shown in FIG. 23, the gate electrode G is electrically coupled to the gate plug P1G via the metal silicide layer 17 (see FIG. 9).

The drain plug P1D is formed in the region positioned on one side of the gate electrode G (on the right side of the gate electrode G as shown in FIG. 23). The source plug P1S is formed in the region positioned on the other side of the gate electrode G (on the left side of the gate electrode G as shown in FIG. 23).

As shown in FIG. 23, in this embodiment, the drain plug P1D is comprised of a plurality of separated drain plugs P1D. That is, the separated drain plugs P1D each having a square pole shape are disposed at first intervals in the direction Y. In other words, the separated drain plugs P1D disposed in the direction Y have a rectangular pattern shape (shape in the planar view from the upper surface), and are disposed at the predetermined intervals in the direction Y.

The source plug P1S is comprised of a plurality of separated source plugs P1S. Unlike the first embodiment, one separated source plug P1S has a square pole having the long side in the direction X. In other words, the separated source plugs P1S have a rectangular pattern shape (shape in the planar view from the upper surface) having a long side in the direction X, and are disposed at predetermined intervals in the direction Y. When the separated source plugs P1S disposed in the direction Y are defined as the separated source plug column, in this embodiment, one column of separated source plugs is disposed in the region on the left side of the gate electrode G.

In this embodiment, one separated drain plug P1D is shifted in the direction Y to be positioned between two adjacent separated source plugs P1S in the direction Y. In other words, each of the separated drain plugs P1D arranged in parallel in the direction Y, and each of the separated source plugs P1S arranged in parallel in the direction Y are alternatively arranged in the direction Y. In other words, the separated drain plugs P1D and the separated source plugs P1S are arranged in a houndstooth manner.

A drain wiring M1D is disposed over each drain plug P1D. A source wiring M1S is disposed over the source plugs P1S. Although not shown in FIG. 23, the gate wiring M1G is disposed over each gate plug P1G (see FIG. 9). As shown in FIG. 23, the drain wiring M1D is divided into separated drain wirings such that each separated drain wiring is disposed over one corresponding separated drain plug P1D among the separated drain plugs P1D. In other words, the drain wiring M1D has a plurality of separated drain wirings M1D disposed at predetermined intervals (second intervals) in the direction Y.

Cutout portions are provided in the source wiring M1S. That is, as shown in FIG. 23, the source wiring M1S extends in the direction Y as a whole, and parts of the end of the wiring M1S positioned on the drain plug P1D side among the ends extending in the direction Y recede in the direction X. The receding part is hereinafter referred to as a cutout portion. The cutout portion is provided to be located between the adjacent separated source plugs P1S in the direction Y. As mentioned above, the separated drain plugs P1D are shifted from the separated source plugs P1S in the direction Y. The cutout portion is provided in the position corresponding to the separated drain plug P1D in the direction Y.

Like the first embodiment, the drain wiring (M2D) is disposed over the drain wiring M1D via the drain plug P2D, and the drain wiring (M3D) is disposed thereover via the drain plug P3D. The illustration thereof will be omitted below. The above drain plug P2D is preferably disposed so as to be located over at least each separated drain wiring M1D. For example, the drain plug P2D is formed in the same pattern shape and layout as those of the separated drain plug P1D shown in FIG. 23. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this embodiment, the separated source plug P1S has a rectangular pattern shape (shape in the planar view from an upper surface) having a long side in the direction X, so that a short side of the pattern shape in the direction Y is opposed to the drain plag P1D, which can decrease the opposed area.

The separation of the drain plug P1D can decrease the opposed area between the source plug P1S and the drain plug P1D. Further, the separation of the drain wiring M1D can also decrease the opposed area between the source plug P1S and the drain wiring M1D. Since the cutout portions are provided in the position corresponding to the separated drain plugs P1D in the direction Y of the source wiring M1S, the distance between the source wiring M1S and the separated drain plug P1D at the cutout portion becomes large, which can reduce the parasitic capacitance. Further, at the cutout portion, the distance between the source wiring M1S and the separated drain wiring 141D also becomes large, which can reduce the parasitic capacitance.

The manufacturing method of the semiconductor device of this embodiment differs from the first embodiment only in the shape of each pattern and layout in the formation steps of the source plug P1S, the drain plug P1D, the drain wiring M1D, and the source wiring M1S, and thus a description of the manufacturing method of this embodiment will be omitted below.

Although in this embodiment, the drain wiring M1D is separated such that the separated drain plug P1D corresponds to the separated wiring M1D one by one, for example, the drain wiring M1D may be separated to step over the separated drain plugs P1D adjacent thereto in the direction Y. Thus, the drain wiring M1D may be separated every separated drain plug P1D.

Seventh Embodiment

Although in the first embodiment, three columns of separated source plugs are provided to make the distance between the separated source plug columns (separated source plugs P1S disposed in the direction Y) constant in the direction Y, the separated source plug on a predetermined column may be removed. Like the fifth embodiment, in this embodiment, <1> the drain plug P1D may be divided into the separated drain plugs, which may be shifted from the separated source plugs P1S in the direction Y, <2> the drain wiring M1D may be separated, and <3> the source wiring M1S may be provided with the cutout portions.

Figure 24:
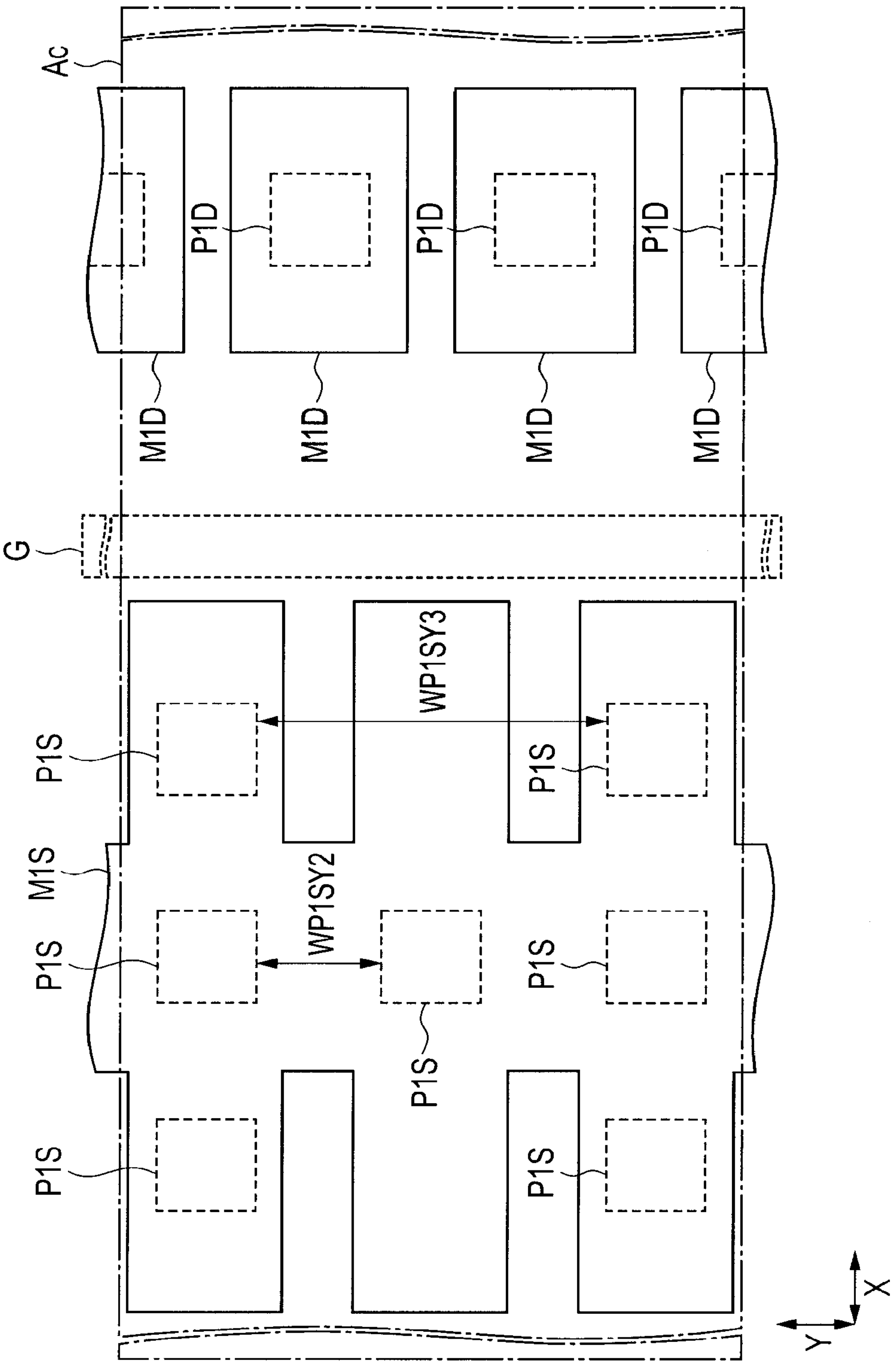
FIG. 24 is a plan view showing a main part of the structure of a semiconductor device according to a seventh embodiment.

FIG. 24 shows a plan view of the structure of a semiconductor device of this embodiment. The structure of the semiconductor device of this embodiment differs from the structure (see FIGS. 1 to 3) of the first embodiment in the layout of the source plug P1S, the shape of the drain plug P1D, the shape of the drain wiring M1D, and the shape of the source wiring M1S. Now, the structure of these elements will be described below in detail, but the description of the structure of other parts will be omitted below.

Description of Structure

The semiconductor device of this embodiment has also the LDMOS with the same structure as that of the first embodiment. That is, the DLMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

As shown in FIG. 24, the gate electrode G extends in the direction Y. The gate electrode G is disposed such that the source region extends in the direction Y in the region positioned on one side of the gate electrode G (on the left side of the gate electrode G in FIG. 24). Further, the gate electrode G is disposed such that the drain region extends in the direction Y in the region positioned on the other side of the gate electrode G (on the right side of the gate electrode G in FIG. 24).

Although not shown in FIG. 24, the metal silicide layer 17 is formed over the drain region, the source region, and the gate electrode G forming the above LDMOS (see FIGS. 1 and 2). The source region is electrically coupled to the source plug P1S via the metal silicide layer 17. The drain region is electrically coupled to the drain plug P1D via the metal silicide layer 17. Although not shown in FIG. 24, the gate electrode G is electrically coupled to the gate plug P1G via the metal silicide layer 17 (see FIG. 9).

The drain plug P1D is formed in the region positioned on one side of the gate electrode G (on the right side of the gate electrode G in FIG. 24), and the source plug P1S is formed in the region positioned on the other side of the gate electrode G (on the left side of the gate electrode G in FIG. 24).

As shown in FIG. 24, in this embodiment, the drain plug P1D is comprised of a plurality of separated drain plugs P1D. That is, the separated drain plugs P1D each having a square pole shape are arranged at first intervals in the direction Y. In other words, the pattern shape (the shape in the planar view from the upper surface) of the separated drain plugs P1D disposed in the direction Y is rectangular. The separated drain plugs P1D are disposed at predetermined intervals in the direction Y.

The source plug P1S is comprised of separated source plugs P1S, which are located in different positions from those of the first embodiment. In the first embodiment shown in FIG. 3, the separated source plugs are arranged in the array in the directions X and Y. For example, in the region shown in FIG. 3, the separated source plugs are arranged in a 3×3 array. In this embodiment, as shown in FIG. 24, the second separated source plugs on the first and third columns from the left side in the figure are removed (which is a decimated structure). In other words, the second separated source plugs P1S on the first and third columns from the left side in the figure are omitted.

In this way, the source plug on the separated source plug column (on the third column in the drain plug P1D as shown in FIG. 24) positioned on the drain plug P1D side is removed to thereby form the separated source plugs P1S the number of which is smaller than that of the other separated source plug column (second column as shown in FIG. 24). Referring to FIG. 24, the separated source plugs P1S on the separated source plug column (third column in FIG. 24) positioned on the drain plug P1D side are arranged on every other column in the direction X with respect to the other separated source plug column (second column as shown in FIG. 24). The separated source plugs P1S on the first separate source plug column shown in FIG. 24 are arranged in the same manner. The first separated source plug column is located on the drain plug (not shown) side positioned on the left side of the drain plug P1D shown in FIG. 25 to thereby form the same decimated structure as that on the third column.

Thus, the distance between the separated source plugs P1S (WP1SY3, or first interval) on the separated source plug column (on the third column of the drain plug P1D shown in FIG. 24) located on the drain plug P1D side is larger than that between the separated source plugs P1S (WP1SY2, or third interval) in the direction Y on the other separated source plug column (on the second column shown in FIG. 24) (WP1SY3>WP1SY2). Thus, the parasitic capacitance between the source plug P1S and the drain plug P1D can be reduced.

In this embodiment, one separated drain plug P1D is shifted in the direction Y to be positioned between two adjacent separated source plugs P1S in the direction Y among the separated source plugs P1S more densely arranged on the separated source plug column (on the second column as shown in FIG. 24).

The drain wiring M1D is disposed over each drain plug P1D. The source wiring M1S is disposed over the source plugs P1S. Although not shown in FIG. 24, the gate wiring M1G is disposed over each gate plug P1G (see FIG. 9). As shown in FIG. 24, the drain wiring M1D is divided into separated drain wirings such that each separated drain wiring is disposed over one corresponding separated drain plug P1D among the separated drain plugs P1D. In other words, the drain wiring M1D has a plurality of separated drain wirings M1D disposed at predetermined intervals (second intervals) in the direction Y.

Cutout portions are provided in the source wiring M1S. That is, as shown in FIG. 24, the source wiring M1S extends in the direction Y as a whole, and parts of the end of the wiring M1S positioned on the drain plug P1D side among the ends extending in the direction Y recede in the direction X. The receding part is hereinafter referred to as a cutout portion. The cutout portion is provided to be located between the adjacent separated source plugs P1S in the direction Y more densely arranged on the separated source plug column (on the second column as shown in FIG. 24). As mentioned above, the separated drain plugs P1D and the separated source plugs P1S are shifted from each other in the direction Y. The cutout portion is located in the position corresponding to the separated drain plug P1D in the direction Y.

Like the first embodiment, the drain wiring (M2D) is disposed over the drain wiring 141D via the drain plug P2D, and the drain wiring (M3D) is disposed thereover via the drain plug P3D. The illustration thereof will be omitted below. The above drain plug P2D is preferably disposed so as to be located over at least each separated drain wiring M1D. For example, the separated drain plug P2D is formed in the same pattern shape and layout as those of the separated drain plug P1D as shown in FIG. 24. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this way, the distance between the separated source plugs P1S (WP1SP3) on the separated source plug column (on the third column of the drain plug P1D shown in FIG. 24) located on the drain plug P1D side is larger than that between the separated source plugs P1S (WP1SY2) in the direction Y on the other separated source plug column (on the second column shown in FIG. 24) (WP1SY3>WP1SY2). Thus, the parasitic capacitance between the source plug P1S and the drain plug P1D can be reduced.

The separation of the drain plug P1D can decrease the opposed area between the source plug P1S and the drain plug P1D. The separation of the drain wiring M1D can decrease the opposed area between the source plug P1S and the drain wiring M1D. Since the cutout portions are provided in the positions corresponding to the separated drain plugs P1D in the direction Y in the source wiring M1S, the distance between the source wiring M1S and the separated drain plug P1D at the cutout portion becomes large, which can reduce the parasitic capacitance. At the cutout portion, the distance between the source wiring M1S and the separated drain wiring M1D becomes large, which can reduce the parasitic capacitance.

The manufacturing method of the semiconductor device of this embodiment differs from the first embodiment in the pattern shape and layout in the formation steps of the source plug P1S, the drain plug P1D, the drain wiring M1D, and the source wiring M1S, and thus a description thereof will be omitted below.

Although in this embodiment, the drain wiring M1D is separated such that the separated drain plug P1D corresponds to the separated wiring M1D one by one, for example, the drain wiring M1D may be separated to step over the separated drain plugs P1D adjacent thereto in the direction Yl. In this way, the drain wiring M1D may be separated every separated drain plug P1D.

Eighth Embodiment

Although in the first embodiment, three columns of separated source plugs are provided with the distance between the respective separate source plug columns (separated source plugs P1S disposed in the direction X) in the direction X set constant, the separated source plug on a predetermined column may be removed. Like the fifth embodiment, <1> the drain plug P1D may be divided into the separated drain plugs, which may be shifted from the separated source plugs P1S in the direction Y, <2> the drain wiring M1D may be separated, and <3> the source wiring M1S may be provided with the cutout portions, like the second embodiment. Further, the pattern shape of the source wiring M1S may be devised such that the cutout portion of the source wiring M1S becomes larger in the region with the separated source plugs removed therefrom.

Figure 25:
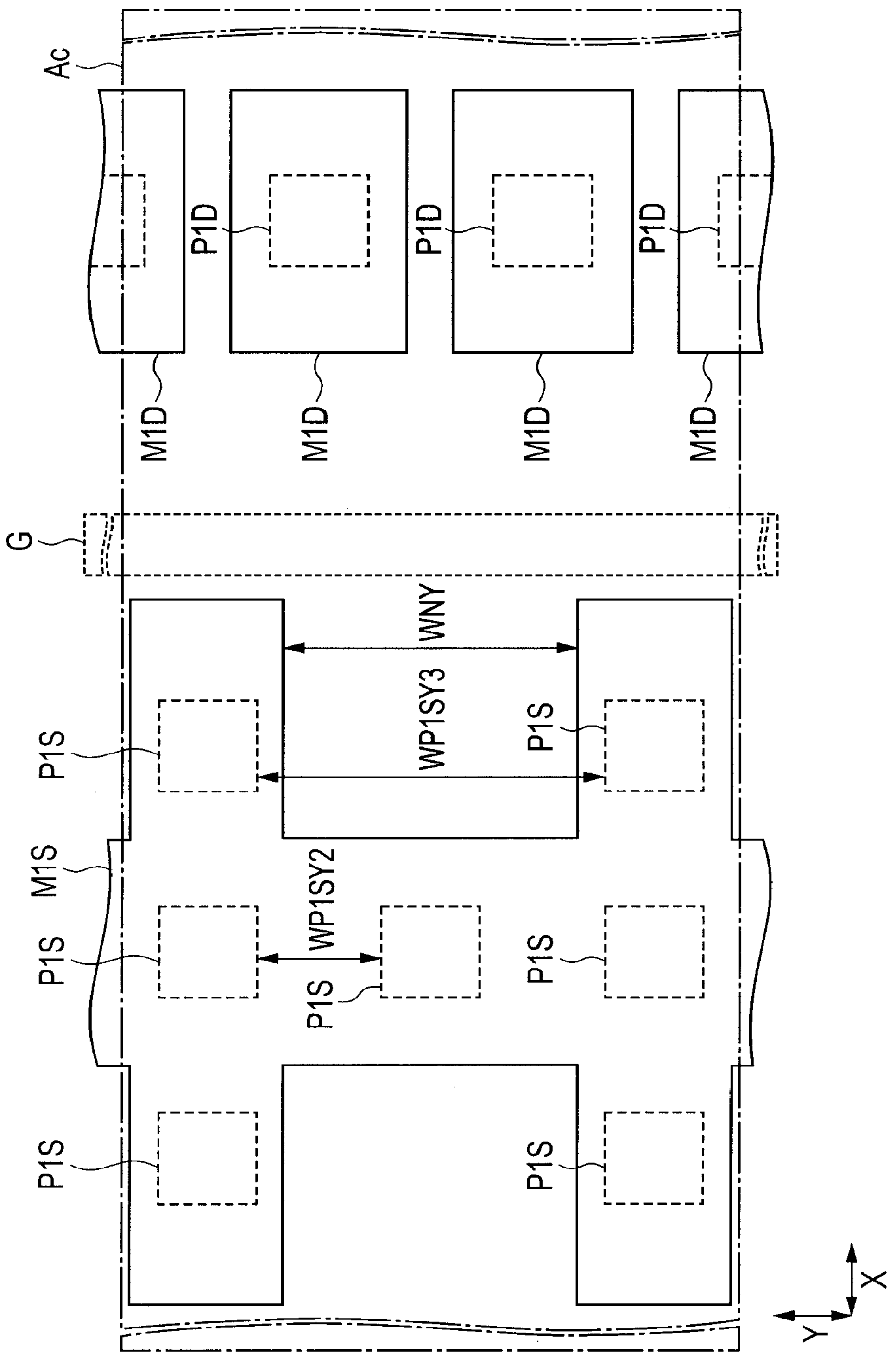
FIG. 25 is a plan view showing a main part of the structure of a semiconductor device according to an eighth embodiment.

FIG. 25 shows a plan view of the structure of a semiconductor device of this embodiment. The structure of this embodiment differs from the structure (see FIGS. 1 to 3) of the first embodiment in the layout of the source plug P1S, the shape of the drain plug P1D, the shape of the drain wiring M1D, and the shape of the source wiring M1S. Now, the structure of these elements will be described below in detail, but the description of the structure of other parts will be omitted below.

Description of Structure

The semiconductor device of this embodiment has also the LDMOS with the same structure as that of the first embodiment. That is, the DLMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

The gate electrode G extends in the direction Y as shown in FIG. 25. The source region is disposed to extend in the direction Y in the region positioned on one side of the gate electrode G (on the left side of the gate electrode G in FIG. 25). Further, the drain region is disposed to extend in the direction Y in the region positioned on the other side of the gate electrode G (on the right side of the gate electrode G in FIG. 25).

Although not shown in FIG. 25, the metal silicide layer 17 is formed over the drain region, the source region, and the gate electrode G forming the above LDMOS (see FIGS. 1 and 2, and the like). The source region is electrically coupled to the source plug P1S via the metal silicide layer 17. The drain region is electrically coupled to the drain plug P1D via the metal silicide layer 17. Although not shown in FIG. 25, the gate electrode G is electrically coupled to the gate plug P1G via the metal silicide layer 17 (see FIG. 9).

The drain plugs P1D are formed in the region positioned on one side of the gate electrode G (on the right side of the gate electrode G as shown in FIG. 25), and the source plugs P1S are formed in the region positioned on the other side of the gate electrode G (on the left side of the gate electrode G as shown in FIG. 25).

As shown in FIG. 25, in this embodiment, the drain plug P1D is comprised of a plurality of separated drain plugs P1D. That is, the separated drain plugs P1D each having the square pole shape are arranged at first intervals in the direction Y. In other words, the pattern shape (shape in the planar view from an upper surface) of the separated drain plugs P1D disposed in the direction Y is rectangular. The separated drain plugs P1D are disposed at predetermined intervals in the direction Y.

The source plug P1S is comprised of a plurality of separated source plugs P1S, which are arranged in different positions from those of the first embodiment. That is, in the first embodiment shown in FIG. 3, the separated source plugs P1S are arranged in an array in the directions X and Y. For example, in the region shown in FIG. 3, the separated source plugs P1S are arranged in a 3×3 array. However, in this embodiment, as shown in FIG. 25, the second separated source plugs on the first and third columns from the left side in the figure are removed (which is a decimated structure). In other words, the second separated source plugs P1S on the first and third columns from the left side in the figure are omitted.

In this way, the source plug on the separated source plug column (on the third column in the drain plug P1D shown in FIG. 25) positioned on the drain plug P1D side is removed to thereby form the separated source plugs P1S the number of which is smaller than that of the separated source plugs on the other separated source plug column (on the second column as shown in FIG. 25). Referring to FIG. 25, the separated source plugs P1S on the separated source plug column (third column in FIG. 25) positioned on the drain plug P1D side are arranged on every other column in the direction X with respect to the separated source plugs P1S on the other separated source plug column (second column as shown in FIG. 25). The separated source plugs P1S of the first separated source plug column shown in FIG. 25 are arranged in the same manner. The first separated source plug column is located on the drain plug (not shown) side positioned on the left side of the drain plug P1D shown in FIG. 25 to thereby form the same decimated structure as that on the third column.

In this way, the distance between the separated source plugs P1S (WP1SY3, or first interval) on the separated source plug column (on the third column of the drain plug P1D shown in FIG. 25) located on the drain plug P1D side is larger than that between the separated source plugs P1S (WP1SY2, or third interval) in the direction Y on the other separated source plug column (on the second column shown in FIG. 25) (WP1SY3>WP1SY2). Thus, the parasitic capacitance between the source plug P1S and the drain plug P1D can be reduced.

In this embodiment, one separated drain plug P1D is shifted in the direction Y to be positioned between two adjacent separated plugs P1S in the direction Y among the separated source plugs P1S more densely disposed on the separated source plug column (on the second column as shown in FIG. 25).

The drain wiring M1D is disposed over each drain plug P1D. The source wiring M1S is disposed over the source plugs P1S. Although not shown in FIG. 25, the gate wiring M1G is disposed over each gate plug P1G (see FIG. 9). As shown in FIG. 25, the drain wiring M1D is divided into separated drain wirings such that each separated drain wiring is disposed over one corresponding separated drain plug P1D among the separated drain plugs P1D. In other words, the drain wiring M1D has a plurality of separated drain wirings M1D disposed at predetermined intervals (second intervals) in the direction Y.

Cutout portions are provided in the source wiring M1S. That is, as shown in FIG. 25, the source wiring M1S extends in the direction Y as a whole, and parts of the end of the wiring M1S positioned on the drain plug P1D side among the ends thereof extending in the direction Y recede in the direction X. The receding part is hereinafter referred to as a cutout portion. The cutout portion is provided to be located between the adjacent separated source plugs P1S in the direction Y. Since in this embodiment, the separated source plugs P1S on the separated source plug columns positioned on the drain plug P1D side (on the first and third columns as shown in FIG. 25) are removed as mentioned above, the source wiring M1S over the columns can be cancelled. Thus, the width of the cutout portion in the direction Y can be increased.

Specifically, the width (WNY) of the cutout portion in the direction Y can be made larger than the distance (WP1SY2) in the direction Y between the separated source plugs P1S on the separated source plug column that are more densely disposed (on the second column in FIG. 25) (that is, WP1SY2<WNY).

Like the first embodiment, the drain wiring (M2D) is disposed over the drain wiring M1D via the drain plug P2D, and further the drain wiring (M3D) is disposed thereover via the drain plug P3D, and thus the illustration of these elements will be omitted below. The drain plug P2D is preferably disposed over at least each separated drain wiring M1D. For example, the separated drain plugs P2D are formed in the same pattern shape and layout as those of the separated drain plugs P1D shown in FIG. 25. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

In this way, the distance between the separated source plugs P1S (WP1SY3) in the direction Y on the separated source plug column (on the third column shown in FIG. 25) located on the drain plug P1D side is larger than that between the separated source plugs P1S (WP1SY2) in the direction Y on the other separated source plug column (on the second column shown in FIG. 25) (WP1SY3>WP1SY2). This arrangement can reduce the parasitic capacitance between the source plug P1S and the drain plug P1D. By increasing the width (WNY) of the cutout portion in the direction Y, the parasitic capacitance between the source wiring M1S and the drain plug P1D can be decreased. The parasitic capacitance between the source wiring M1S and the drain wiring M1D can be decreased.

The separation of the drain plug P1D can decrease the opposed area between the source plug P1S and the drain plug P1D. The separation of the drain wiring M1D can decrease the opposed area between the source plug P1S and the drain wiring MD. The provision of the cutout portion corresponding to the separated drain plug P1D in the direction Y at the source wiring M1S increases the distance between the source wiring M1S and the separated drain plug P1D at the cutout portion, which can decrease the parasitic capacitance therebetween. Further, at the cutout portion, the distance between the source wiring M1S and the separated drain wiring M1D also becomes large, which can reduce the parasitic capacitance. In this embodiment, the separated source plugs on the separated source plug columns (on the first and third columns shown in FIG. 25) positioned on the drain plug P1D side are removed, whereby the parts of the source wiring M1S located over the cutout portions can be omitted. The width of the cutout portion in the direction Y can be increased to further reduce the parasitic capacitance.

The manufacturing method of the semiconductor device of this embodiment differs from the first embodiment in the pattern shape and the layout in the formation steps of the source plug P1S, the drain plug P1D, the drain wiring M1D, and the source wiring M1S. Thus, a description of the manufacturing method will be omitted below.

Although in this embodiment, the drain wiring M1D is separated such that the separated drain plug P1D corresponds to the separated drain wiring M1D one by one, for example, the drain wiring M1D may be separated to step over the separated drain plugs P1D adjacent thereto in the direction Yl. As mentioned above, the drain wiring M1D may be separated every separated drain plug P1D.

Ninth Embodiment

Although in the first embodiment, the source wiring M1S is disposed over the source plug P1S, the source wiring M1S may be omitted. Like the seventh or eighth embodiment, <1> the separated source plug on a predetermined column among the three separated source plug columns may be removed, <2> the drain plug P1D may be divided into the separated drain plugs, which may be shifted from the separated source plugs P1S in the direction Y, and <3> the drain wiring M1D may be separated.

Figure 26:
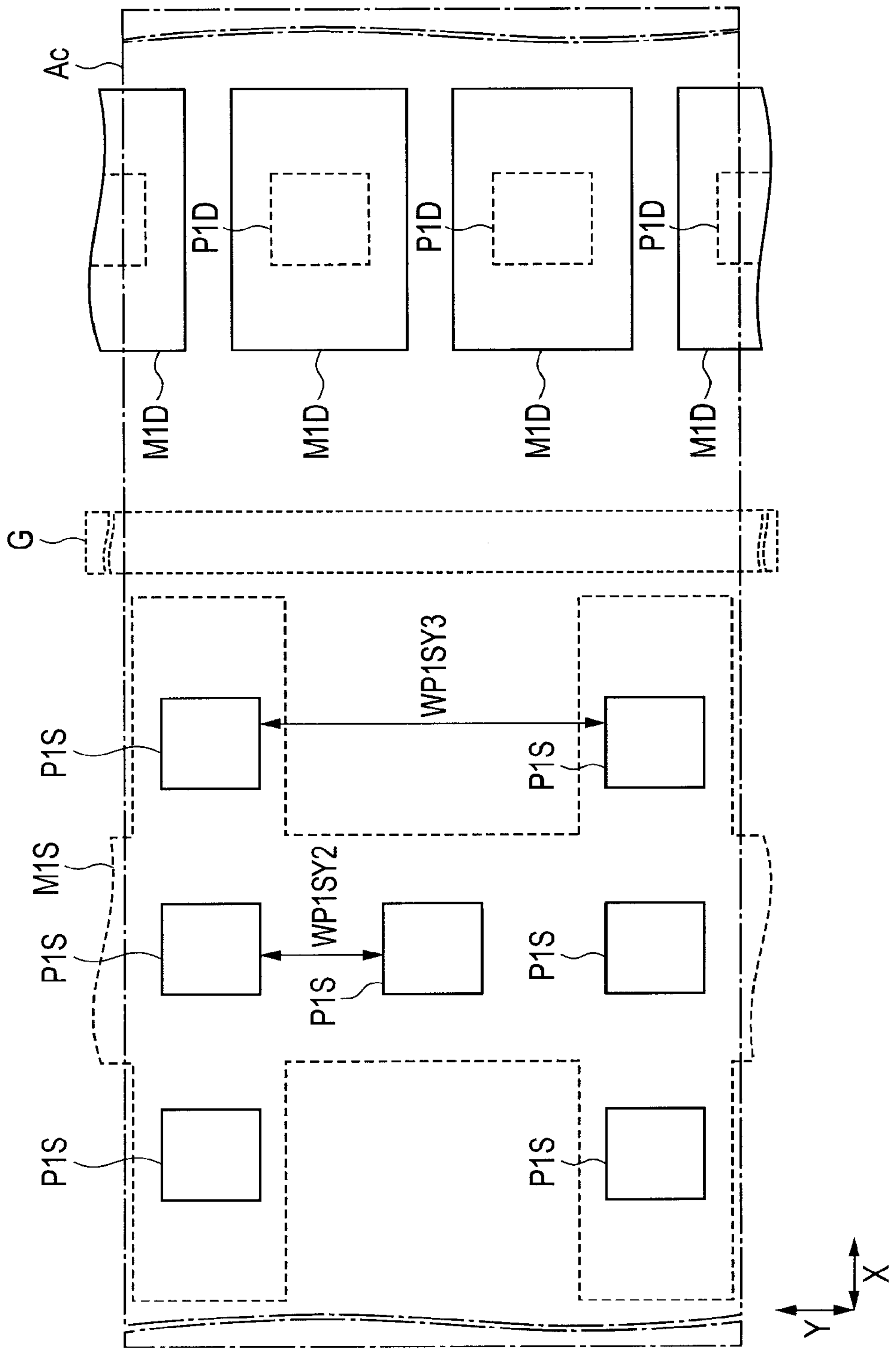
FIG. 26 is a plan view showing a main part of the structure of a semiconductor device according to a ninth embodiment.

FIG. 26 shows a plan view of the structure of a semiconductor device of this embodiment. The structure of this embodiment differs from the structure (see FIGS. 1 to 3) of the first embodiment in the layout of the source plug P1S, the shape of the drain plug P1D, the shape of the drain wiring M1D, and the structure without formation of the source wiring M1S. Now, the structure of these elements will be descried in detail below, but the description of the structure of other parts will be omitted below.

Description of Structure

The semiconductor device of this embodiment also has the LDMOS with the same structure as that of the first embodiment. That is, the DLMOS includes the drain region comprised of the first $n^-$-type drain region 10, the second $n^-$-type drain region 13, and the $n^+$-type drain region 14; the source region comprised of the $n^-$-type source region 11 and the $n^+$-type source region 15; and the gate electrode G formed between the source and drain regions (in a channel formation region) via the gate insulating film 8 (see FIGS. 1 and 2, and the like).

The gate electrode G extends in the direction Y as shown in FIG. 26. A source region is disposed to extend in the direction Y in the region positioned on one side of the gate electrode G (on the left side of the gate electrode G in FIG. 26). A drain region is disposed to extend in the direction Y in the region positioned on the other side of the gate electrode G (on the right side of the gate electrode G in FIG. 26).

Although not shown in FIG. 26, the metal silicide layer 17 is formed over the drain region, the source region, and the gate electrode G forming the above LDMOS (see FIG. 1, and the like). The source region is electrically coupled to the source plug P1S via the metal silicide layer 17. The drain region is electrically coupled to the drain plug P1D via the metal silicide layer 17. Although not shown in FIG. 26, the gate electrode G is electrically coupled to the gate plug P1G via the metal silicide layer 17 (see FIG. 9).

The drain plugs P1D are formed in the region positioned on one side of the gate electrode G (on the right side of the gate electrode G as shown in FIG. 26). The source plugs P1S are formed in the region positioned on the other side of the gate electrode G (on the left side of the gate electrode G as shown in FIG. 26).

As shown in FIG. 26, in this embodiment, the drain plug P1D is comprised of a plurality of separated drain plugs P1D. That is, the separated drain plugs P1D each having a square pole shape are arranged at first intervals in the direction Y. In other words, the separated drain plugs P1D disposed in the direction Y have a rectangular pattern shape (shape in the planar view from the upper surface), and are disposed at the predetermined intervals in the direction Y.

The source plug P1S is comprised of separated source plugs P1S, which are located in different positions from those of the first embodiment. That is, in the first embodiment shown in FIG. 3, the separated source plugs are arranged in the array in the directions X and Y. For example, in the region shown in FIG. 3, the separated source plugs P1S are arranged in a 3×3 array in the region shown in FIG. 3. In this embodiment, as shown in FIG. 26, the second separated source plugs on the first and third columns from the left side in the figure are removed (which is a decimated structure). In other words, the second separated source plugs P1S on the first and third columns from the left side in the figure are omitted.

In this way, the separated source plug on the separated source plug column (on the third column in the drain plug P1D as shown in FIG. 26) positioned on the drain plug P1D side is removed to thereby form the separated source plugs P1S the number of which is smaller than that of the separated source plugs on the other separated source plug column (second column as shown in FIG. 26). Referring to FIG. 26, the separated source plugs P1S of the separated source plug column (third column in FIG. 26) positioned on the drain plug P1D side are arranged on every other column in the direction X with respect to the separated source plugs P1S on the other separated source plug column (second column as shown in FIG. 26). The separated source plugs P1S on the first separate source plug column shown in FIG. 26 are arranged in the same manner. The first separated source plug column is located on the drain plug (not shown) side positioned on the left side of the drain plug P1D shown in FIG. 26 to thereby form the same decimated structure as that on the third column.

Thus, the distance between the separated source plugs P1S (WP1SY3 or first interval) in the direction Y on the separated source plug column (that is, on the third column in the drain plug P1D shown in FIG. 26) located on the drain plug P1D side is larger than that between the separated source plugs P1S (WP1SY2, third interval) in the direction Y on the other separated source plug column (on the second column shown in FIG. 26) (WP1SY3>WP1SY2). This arrangement can reduce the parasitic capacitance between the source plug P1S and the drain plug P1D.

In this embodiment, one separated drain plug P1D is shifted in the direction Y to be positioned between two adjacent separated plugs P1S in the direction Y, among the separated source plugs P1S on the separated source plug column more densely disposed (on the second column as shown in FIG. 26).

A drain wiring M1D is disposed over the drain plugs P1D. Although not shown in FIG. 26, the gate wiring M1G is disposed over the gate plug P1G (see FIG. 9). As shown in FIG. 26, the drain wiring M1D is divided into separated drain wirings such that each separated drain wiring is disposed over the corresponding separated drain plug P1D among the separated drain plugs P1D. In other words, the drain wiring M1D has a plurality of separated drain wirings M1D disposed at predetermined intervals (second intervals) in the direction Y.

In this embodiment, the source wiring M1S on the source plugs P1S is omitted. In other words, the source wiring M1S for establishing electrical coupling to the source plug P1S is not formed on the source plug P1S. That is, the upper surface of the source plug P1S is covered with an insulating film (interlayer insulating film) 24.

As described in the first embodiment, the source electrode SE is formed at the back side of the substrate 1 (see FIGS. 1, 2, and 14). The electrical coupling between a coupling part of a wiring board and the source region is established via the above source electrode SE. The source plug P1S and the source wiring M1S are formed for the purpose of current pass and reduction in resistance of the source region. Thus, even the omission of the source wiring M1S does not affect the operation of the LDMOS.

Like the first embodiment, the drain wiring (M2D) is disposed over the drain wiring M1D via a drain plug P2D, and further, the drain wiring (M3D) is disposed thereover via the drain plug P3D. The illustration thereof will be omitted below. The above drain plug P2D is preferably disposed so as to be located over at least each separated drain wiring M1D. For example, the separated drain plugs P2D having the same pattern shape and layout as those of the separated drain plugs P1D shown in FIG. 26 are formed. The drain wiring (M2D) over the separated drain plug P2D may be linear. In this case, the drain plug (P3D) and the drain wiring (M3D) can also be linear. It is apparent that the drain wiring (M2D), the drain plug (P3D), and the drain wiring (M3D) may be separated.

Thus, the omission of the source wiring M1S can set the parasitic capacitance between the source wiring M1S and the drain plug P1D to zero (0), and further can set the parasitic capacitance between the source wiring M1S and the drain wiring M1D to zero (0).

The separation of the drain plug P1D can decrease the opposed area between the source plug P1S and the drain plug P1D. Further, the separation of the drain wiring M1D can also decrease the opposed area between the source plug P1S and the drain wiring M1D.

The manufacturing method of the semiconductor device of this embodiment differs from the method of the first embodiment in each pattern shape and layout in the formation steps of the source plug P1S, the drain plug P1D, and the drain wiring M1D, specifically, in that only the formation step of the source wiring M1S is omitted. Thus, a description of the manufacturing method will be omitted below.

Although in this embodiment, the drain wiring M1D is separated such that the separated drain plug P1D corresponds to the separated drain wiring M1D one by one, for example, the drain wiring 141D may be separated to step over the separated drain plugs P1D adjacent thereto in the direction Y. As mentioned above, the drain wiring M1D may be separated every separated drain plug P1D.

The present invention made by the inventors have been specifically described based on the embodiments disclosed herein. It is apparent that the invention is not limited thereto, and that various changes can be made to the disclosed embodiments without departing from the scope of the invention.

For example, the drain plug P1D and the drain wiring M1D of the first embodiment shown in FIG. 3 can be used instead of the drain plug P1D and the drain wiring M1D of the fourth embodiment shown in FIG. 21.

For example, the source wiring M1S of the first embodiment shown in FIG. 3 may be used instead of the source wiring M1S of the fifth embodiment shown in FIG. 22.

The drain plug P1D and the drain wiring M1D of the first embodiment shown in FIG. 3 may be used instead of the drain plug P1D and the drain wiring M1D of the sixth embodiment shown in FIG. 23. The drain plug P1D and the drain wiring M1D of the fourth embodiment shown in FIG. 21 may be used instead of the drain plug P1D and the drain wiring M1D of the sixth embodiment shown in FIG. 23.

The drain plug P1D and the drain wiring M1D of the first embodiment shown in FIG. 3 may be used instead of the drain plug P1D and the drain wiring M1D of the seventh embodiment shown in FIG. 24. The drain plug P1D and the drain wiring M1D of the fourth embodiment shown in FIG. 21 may be used instead of the drain plug P1D and the drain wiring 141D of the seventh embodiment shown in FIG. 24.

The drain plug P1D and the drain wiring M1D of the first embodiment shown in FIG. 3 may be used instead of the drain plug P1D and the drain wiring M1D of the eighth embodiment shown in FIG. 25. The drain plug P1D and the drain wiring M1D of the fourth embodiment shown in FIG. 21 may be used instead of the drain plug P1D and the drain wiring M1D of the eighth embodiment shown in FIG. 25.

The drain plug P1D and the drain wiring 141D of the first embodiment shown in FIG. 3 may be used instead of the drain plug P1D and the drain wiring M1D of the ninth embodiment shown in FIG. 26. The drain plug P1D and the drain wiring M1D of the fourth embodiment shown in FIG. 21 may be used instead of the drain plug P1D and the drain wiring M1D of the ninth embodiment shown in FIG. 26. The source plug P1S of the first embodiment shown in FIG. 3 may be used instead of the source plug P2S of the ninth embodiment shown in FIG. 26.

In the above embodiments, the source backside electrode SE is formed and the coupling to the wiring board is established from the back side of the substrate. In the structures other than the example of the structure associated with the above ninth embodiment, a source pad region may be formed at the upper surface of the substrate without forming the source backside electrode SE. For example, a multilayered wiring including a second layer wiring coupled to the source wiring M1S and a third layer wiring may be provided over the source wiring M1S. By using a part of the uppermost layer wiring as a source pad region, the source pad region may be coupled to an external connection terminal of the wiring board via a wire (gold wire) and the like.

Thus, the invention is not limited to the above embodiments, and various modifications and changes can be made to the disclosed embodiments without departing from the scope of the invention.

The present invention relates to semiconductor devices, and more specifically, the techniques effectively applied to the semiconductor device having a LDMOS.

What is claimed is:

1. A semiconductor device, comprising:

(a) a laterally diffused MISFET, including:

(a1) a gate electrode disposed over a first surface of a semiconductor substrate via a gate insulating film to extend in a first direction in plan view; and (a2) a source region disposed in the semiconductor substrate on one side of the gate electrode, and a drain region disposed in the semiconductor substrate on the other side of the gate electrode;

(b) a source plug disposed in a second region located on the one side of the gate electrode over the semiconductor substrate to be electrically coupled to the source region;

(c) a source wiring disposed over the source plug;

(d) a drain plug disposed in a first region located on the other side of the gate electrode over the semiconductor substrate to be electrically coupled to the drain region; and (e) a drain wiring disposed over the drain plug, wherein the drain plug is linearly disposed in the first region to extend in the first direction in plan view, wherein the source plug includes a plurality of separated source plugs arranged at predetermined intervals in the first direction in the second region in plan view, wherein the source plugs include a first separated source plug column and a second separated source plug column, wherein the first separated source plug column includes a plurality of separated source plugs arranged at first intervals in the first direction, wherein the second separated source plug column includes a plurality of separated source plugs arranged in the first direction at third intervals smaller than the first intervals, and wherein the first separated source plug column is disposed closer to the drain plug side than to the second separated source plug column.

2. The semiconductor device according to claim 1, wherein a distance between the drain region and the other side end of the gate electrode is larger than that between the source region and one side end of the gate electrode.

3. The semiconductor device according to claim 1, wherein a compound layer including a metal and a semiconductor for forming the semiconductor substrate is formed in the first region of the semiconductor substrate.

4. The semiconductor device according to claim 1, wherein the semiconductor substrate includes an epitaxial layer, and the laterally diffused MISFET is formed over a main surface of the epitaxial layer.

5. The semiconductor device according to claim 1, wherein the source wiring includes a cutout portion that is disposed between the separated source plugs.

6. The semiconductor device according to claim 1, wherein the source wiring includes a cutout portion that has a width in the first direction larger than the predetermined interval.

7. The semiconductor device according to claim 1, wherein the source wiring is linearly disposed in the second region to extend in the first direction so as to cover the separated source plugs.

* * * * *